(12) United States Patent
Kitazawa et al.

(10) Patent No.: US 8,114,529 B2
(45) Date of Patent: Feb. 14, 2012

(54) MATERIAL FOR LIGHTING EMITTING DEVICE AND LIGHT EMITTING DEVICE

(76) Inventors: Daisuke Kitazawa, Shiga (JP); Tsuyoshi Tominaga, Shiga (JP); Mariko Sano, Shiga (JP); Takeshi Ishigaki, Kanagawa (JP); Kazunori Sugimoto, Shiga (JP)

( * ) Notice: Subject to any disclaimer, the term of this patent is extended or adjusted under 35 U.S.C. 154(b) by 556 days.

(21) Appl. No.: 11/660,964

(22) PCT Filed: Aug. 23, 2004

(86) PCT No.: PCT/JP2004/012054
§ 371 (c)(1),
(2), (4) Date: Jul. 2, 2007

(87) PCT Pub. No.: WO2006/021982
PCT Pub. Date: Mar. 2, 2006

(65) Prior Publication Data
US 2007/0267958 A1    Nov. 22, 2007

(51) Int. Cl.
*C09K 11/06*    (2006.01)
*H01L 51/54*    (2006.01)
(52) U.S. Cl. ........ 428/690; 428/917; 313/504; 313/506; 546/36; 546/88
(58) Field of Classification Search .................. None
See application file for complete search history.

(56) References Cited

U.S. PATENT DOCUMENTS

| 6,010,796 A * | 1/2000 | Kijima ..................... 428/690 |
| 2003/0168970 A1 | 9/2003 | Tominaga et al. |

FOREIGN PATENT DOCUMENTS

| EP | 1285957 | 2/2003 |
| JP | 2001-267080 | 9/2001 |
| JP | 2003-109767 | 4/2003 |
| JP | 2003-109768 | 4/2003 |
| JP | 2003-338377 | 11/2003 |
| JP | 2004-55258 | 2/2004 |
| JP | 2004-200162 | * 7/2004 |
| JP | 2004-281390 | 10/2004 |
| WO | 02/43449 A1 | 5/2002 |

OTHER PUBLICATIONS

Translation of description section for JP 2001-267080 A published Sep. 28, 2001.*
Translation of description section for JP 2004-200162 A published Jul. 15, 2004.*
Dietrich-Buchecker et al., J. Chem. Soc., Chem. Commun., (1994), pp. 2231-2232.*

* cited by examiner

*Primary Examiner* — Dawn L. Garrett
(74) *Attorney, Agent, or Firm* — Pillsbury Winthrop Shaw Pittman LLP

(57) ABSTRACT

The invention provides a light emitting device having a low driving voltage and excellent durability by a material for a light emitting device expressed by the general formula (1):

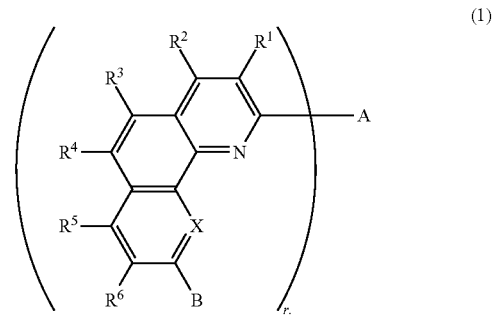

(1)

wherein each of $R^1$, $R^2$, $R^3$, $R^4$, $R^5$ and $R^6$ may be the same or different and is selected from hydrogen, an alkyl group, and an aryl group, A represents an n-valent aromatic hydrocarbon group, B represents an alkyl group or an aryl group, X represents carbon or nitrogen, n represents a natural number from 2 to 6, and n substituents having a phenanthroline skeleton or a benzoquinoline skeleton may be the same or different.

8 Claims, No Drawings

MATERIAL FOR LIGHTING EMITTING DEVICE AND LIGHT EMITTING DEVICE

TECHNICAL FIELD

The present invention relates to a material for a light emitting device and a light emitting device which uses the same and can be used for the areas such as a display device, a flat panel display, a backlight, illumination, interior decoration, a sign, a signboard, a electron camera and a optical signal generator.

BACKGROUND ART

In recent years, studies on an organic electroluminescence device which emits light when an electron injected from a cathode and a hole injected from an anode are recombined within an organic fluorescent substance sandwiched between both electrodes are actively made. This device is characterized by a low-profile, emission of high emission brightness at a low driving voltage and multicolor emission by selecting a fluorescent material, and receives attention. The studies on this device have been made by many research laboratories since C. W. Tang et al. of Kodak Company have shown that the organic electroluminescence device emits light at high brightness.

Earnest studies are made aimed at realizing full color display. As an emissive material, not only fluorescent materials but also phosphorescent materials are studied. Further, as for a charge transporting material, studies on a hole transporting material have been hitherto heavily made but recently, earnest studies on an electron transporting material are made (see, for example, Patent Documents 1 to 5).

Patent Document 1: Japanese Unexamined Patent Publication No. 5-331459 (scope of claims)
Patent Document 2: Japanese Unexamined Patent Publication No. 2000-119644 (p 17)
Patent Document 3: International Publication WO 00/03565 (scope of claims)
Patent Document 4: Japanese Unexamined Patent Publication No. 2003-115387 (scope of claims)
Patent Document 5: Japanese Unexamined Patent Publication No. 2003-123983 (scope of claims).

DISCLOSURE OF THE INVENTION

Problems to be Solved by the Invention

However, many of hitherto employed emissive materials, hole transporting materials, and electron transporting materials have low durability. The reason for this is that materials are crystallized by heat-producing of a device due to a long-duration energization and a device life is shortened. On the other hand, most of materials provided with amorphousness for suppressing this crystallization cause denaturation such as degradation or polymerization at the time of vacuum deposition because of a low sublimation property. Such denaturation became an obstacle to the actual use since it does not have an effect on device performance in the vapor deposition of laboratory scale but it causes significant reduction in device performance in the conditions of charging materials in large quantity and heating them for a long time at the time of mass production.

Further, since the light emitting devices to which conventional materials are applied often have a high driving voltage and needs applications of a high voltage in order to achieve desired emission brightness, the large load on the light emitting device became an obstacle to the actual use.

It is an object of the present invention to provide a light emitting device which solves such problems of the prior art and has a low driving voltage and excellent durability.

The present invention pertains to a material for a light emitting device expressed by the general formula (1):

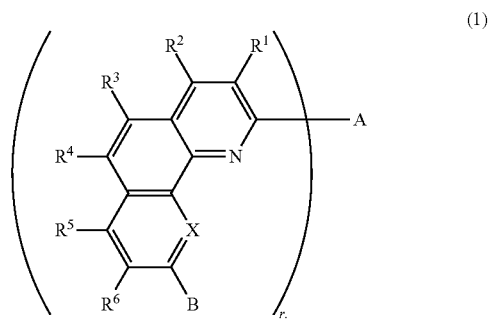

wherein each of $R^1$, $R^2$, $R^3$, $R^4$, $R^5$ and $R^6$ may be the same or different and is selected from hydrogen, an alkyl group, and an aryl group, A represents an n-valent aromatic hydrocarbon group, B represents an alkyl group or an aryl group, X represents carbon or nitrogen, n represents a natural number from 2 to 6, and n substituents having a phenanthroline skeleton or a benzoquinoline skeleton may be the same or different.

Further, the present invention pertains to a light emitting device having an organic layer existing between an anode and a cathode and emitting light by electrical energy, wherein the organic layer contains the material for a light emitting device expressed by the general formula (1).

Effect by the Invention

When the material for a light emitting device of the present invention is used, a light emitting device having a low driving voltage and excellent durability can be provided.

BEST MODE FOR CARRYING OUT THE INVENTION

First, a material for a light emitting device expressed by the general formula (1) in the present invention will be described in detail.

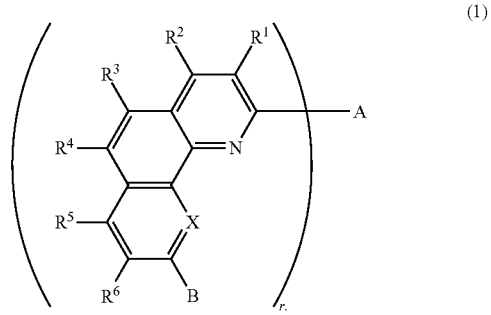

In the above formula (1), each of $R^1$, $R^2$, $R^3$, $R^4$, $R^5$ and $R^6$ may be the same or different and is selected from hydrogen, an alkyl group, and an aryl group. A represents an n-valent aromatic hydrocarbon group. Here, the alkyl group represents saturated aliphatic hydrocarbon groups such as a methyl group, an ethyl group, a propyl group and a butyl group, and the aryl group represents aromatic hydrocarbon groups such as a phenyl group, a tolyl group, a biphenyl group, a naphthyl group, a phenanthryl group and an anthryl group and may be unsubstituted or substituted. The alkyl group preferably has 1 to 20 carbon atoms. Further, the aryl group preferably has 5 to 30 carbon atoms.

X is carbon or nitrogen. When X is carbon, a compound of the general formula (1) becomes a compound having a benzoquinoline skeleton. On the other hand, when X is nitrogen, a compound of the general formula (1) becomes a compound having a phenanthroline skeleton. In order to reduce a driving voltage of the light emitting device more, the mobility of careers of the material is preferably high. Therefore, X in the general formula (1) is preferably nitrogen.

n is a natural number from 2 to 6. Further, n substituents having a phenanthroline skeleton or a benzoquinoline skeleton may be the same or different. The above-mentioned n is more preferably 2 from the viewpoint of synthesizing and purifying easily in addition to the viewpoint of balancing between a sublimation property and a film forming ability at the time of vacuum deposition.

When a molecular weight of the material is too large, the sublimation property is deteriorated and a probability of thermally decomposing at the time of vacuum deposition increases. On the other hand, when a molecular weight of the material is too small, the film forming ability is low and thereby, performance of the light emitting device is often deteriorated. From the viewpoint of balancing between the sublimation property and the film forming ability, A in the general formula (1) is preferably a substituted or unsubstituted phenylene group or a substituted or unsubstituted naphthylene group.

Further, in the general formula (1), it is one feature of the present invention that an alkyl group or an aryl group is substituted for a position of B. Thereby, thermal decomposition becomes hard to occur at the time of vacuum deposition compared with the case where hydrogen exists at the position of B. In addition, thereby, crystallization is inhibited and therefore a uniform thin film becomes easy to form and a thin film becomes resistant to the degradation due to the development of crystallization even for a long-duration emission. The alkyl group preferably has 1 to 20 carbon atoms. Further, the aryl group preferably has 5 to 30 carbon atoms. Further, B is preferably at least one kind selected from a methyl group, a t-butyl group, a substituted or unsubstituted phenyl group and a substituted or unsubstituted naphthyl group.

In the above-mentioned compounds, a material for a light emitting device expressed by the general formula (2):

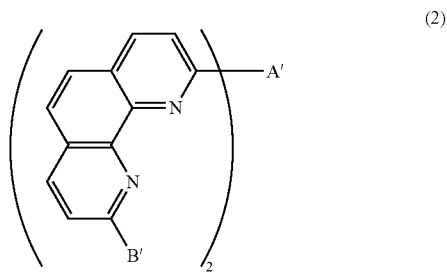

(2)

wherein A' is at least one kind selected from a 1,3-phenylene group, a 1,4-phenylene group, a 1,4-naphthylene group, a 1,5-naphthylene group, and a 2,7-naphthylene group, and B' is at least one kind selected from a methyl group, a t-butyl group, a substituted or unsubstituted phenyl group and a substituted or unsubstituted naphthyl group, is suitably used in that this material is particularly superior in the sublimation property, the film forming ability and the ease of synthesis.

Specific examples of the above-mentioned material for a light emitting device include the following structures, but it is not particularly limited.

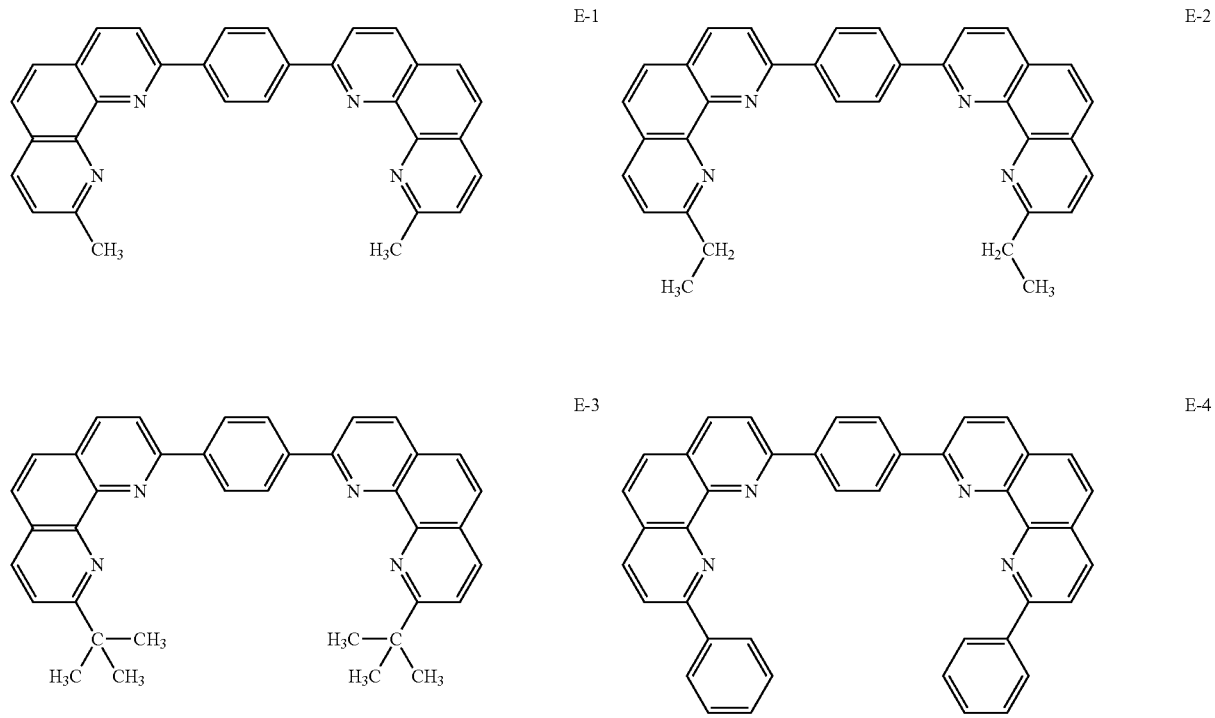

-continued
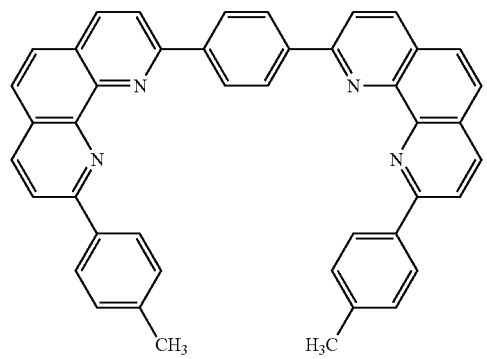
E-5
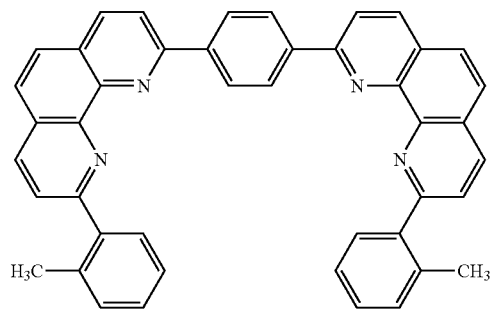
E-6
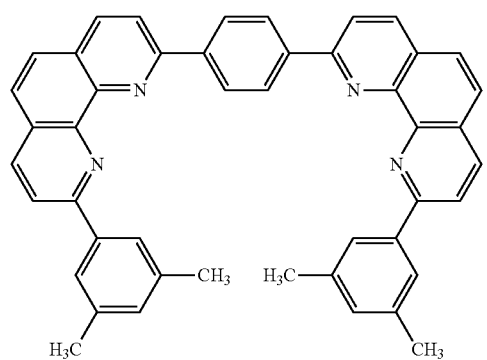
E-7
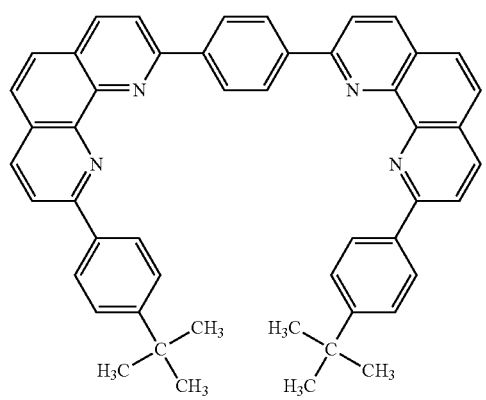
E-8
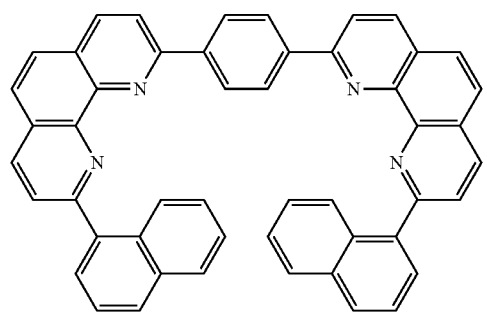
E-9
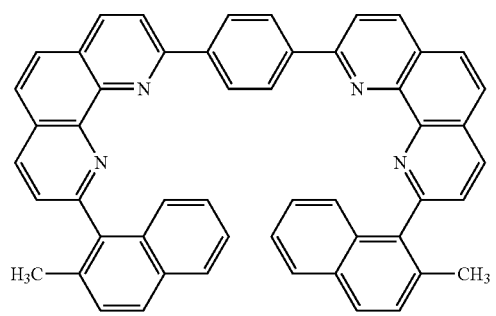
E-10
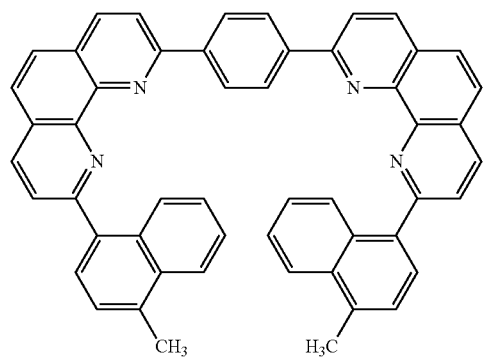
E-11
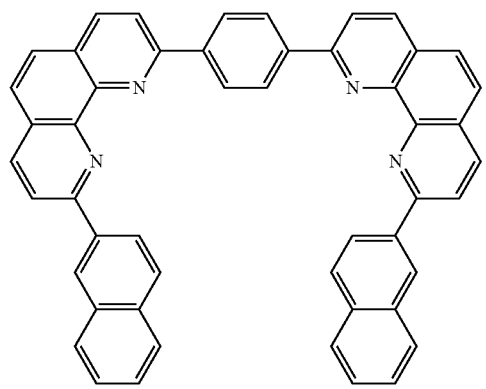
E-12

-continued
E-13
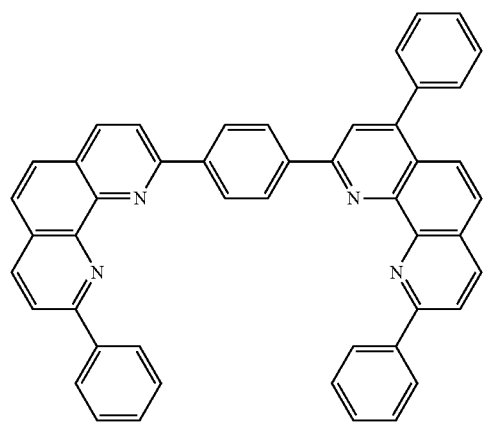
E-14
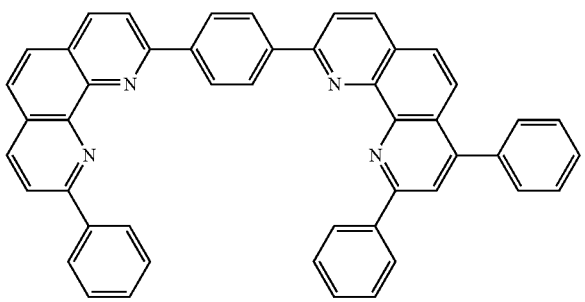
E-15
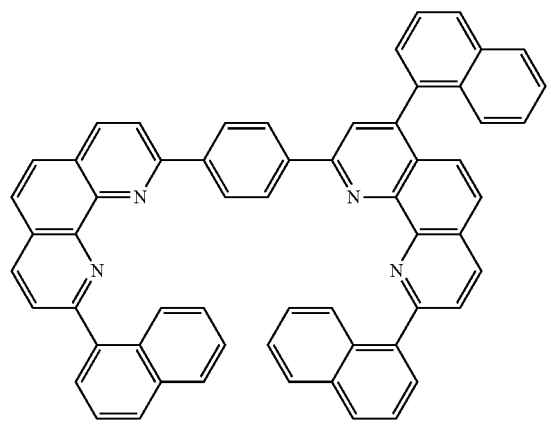
E-16
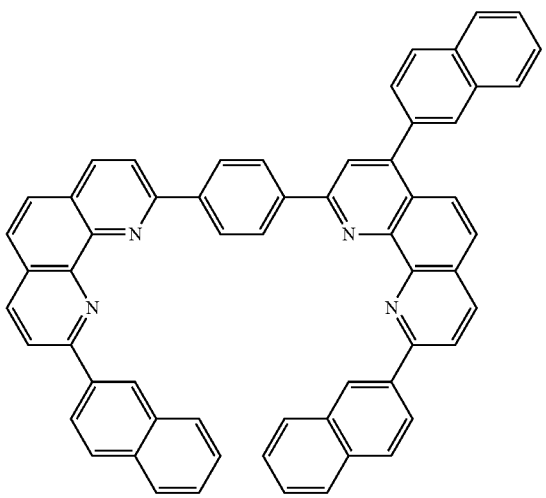
E-17
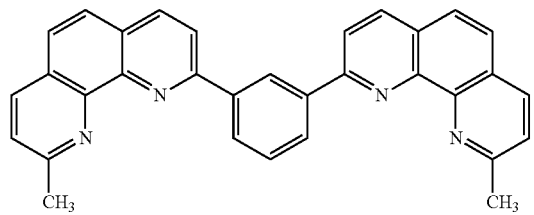
E-18
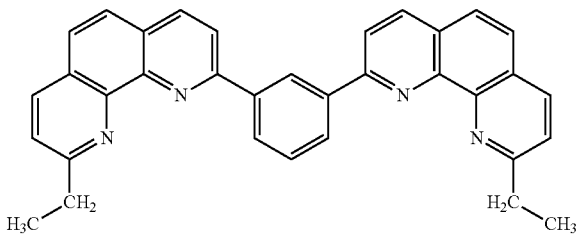
E-19
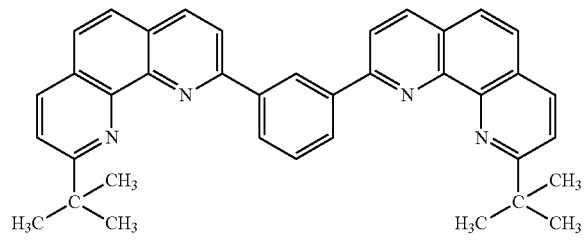
E-20
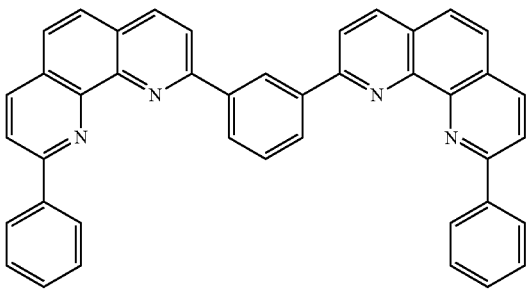

-continued
E-21
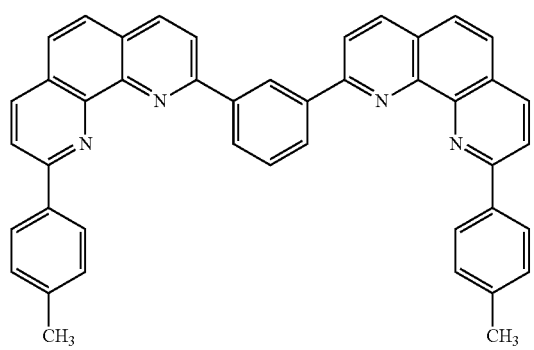
E-22
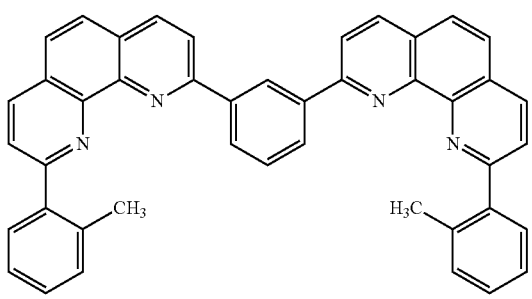
E-23
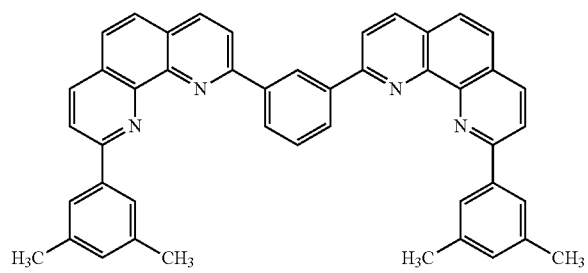
E-24
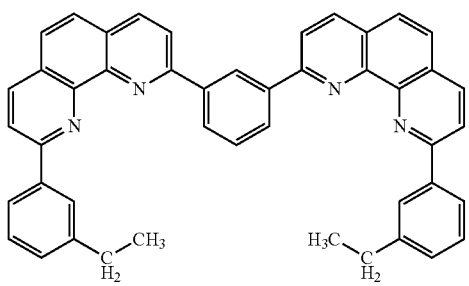
E-25
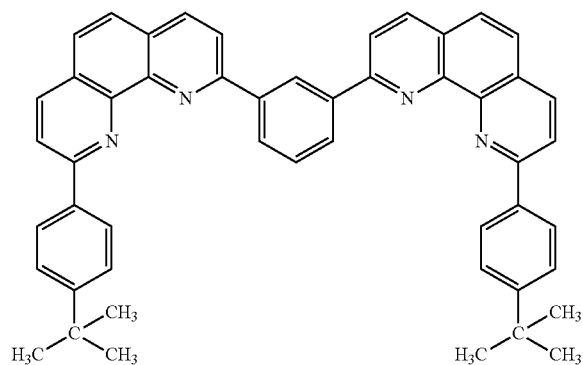
E-26
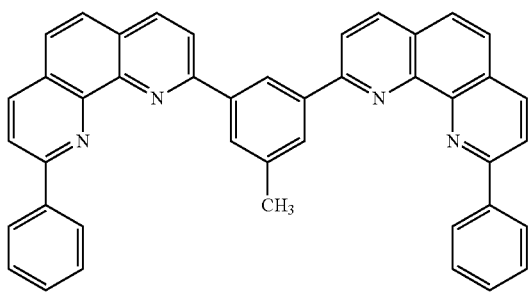
E-27
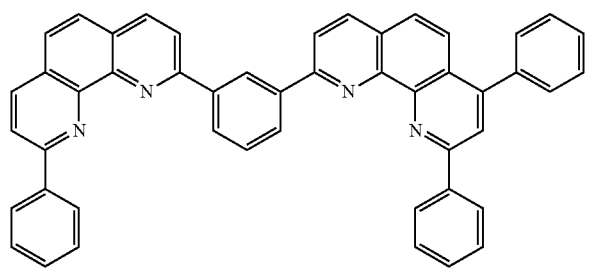
E-28
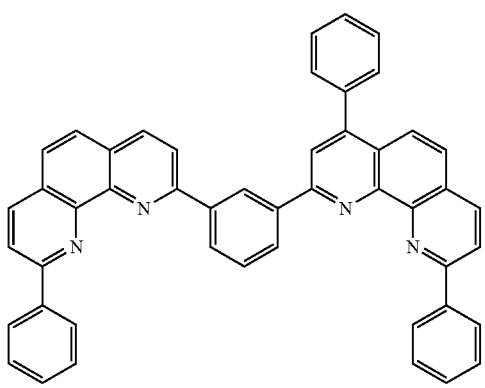

-continued
E-29
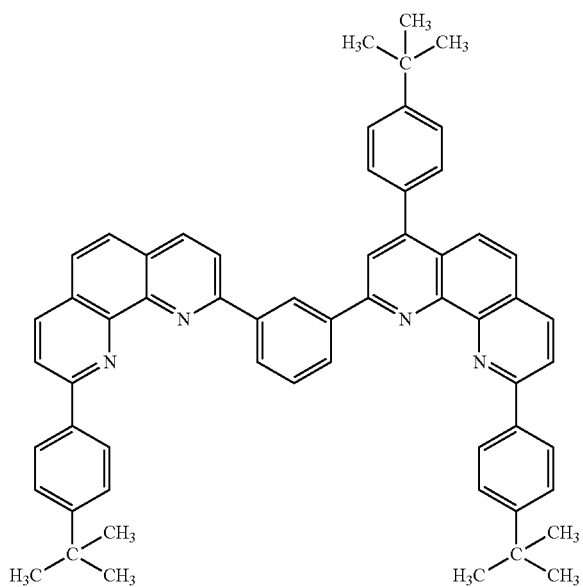
E-30
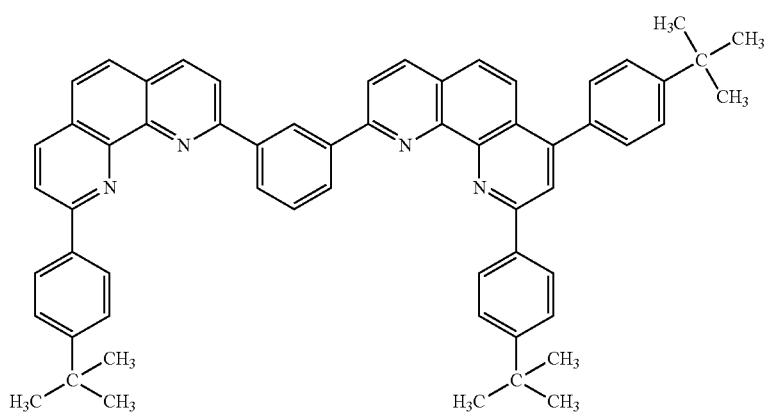
E-31
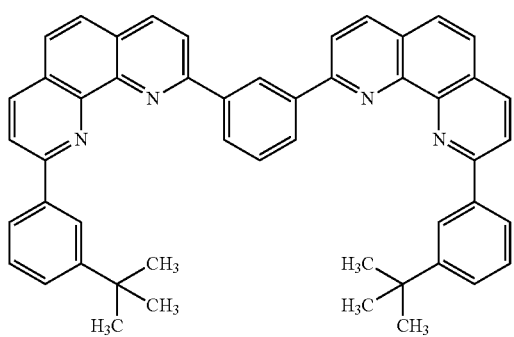
E-32
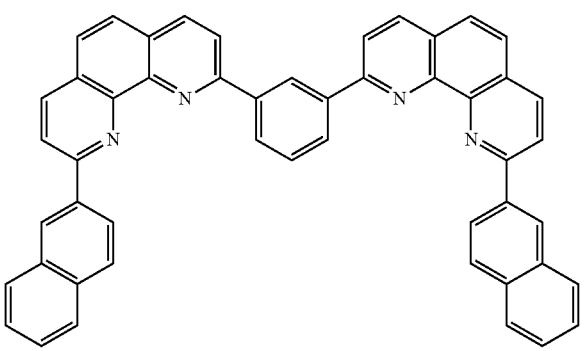
E-33
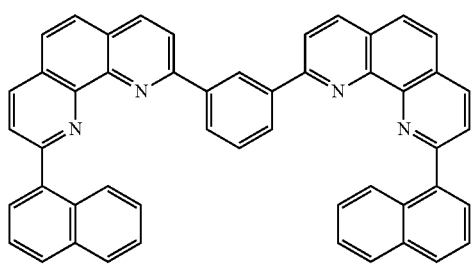
E-34
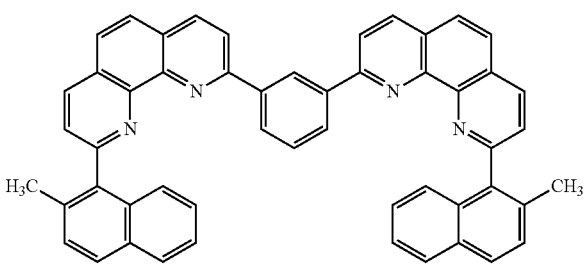

-continued
E-35
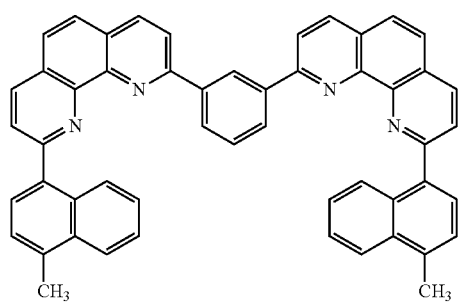
E-36
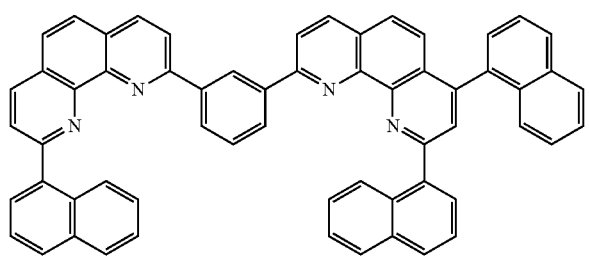
E-37
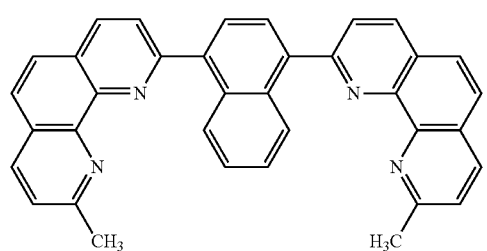
E-38
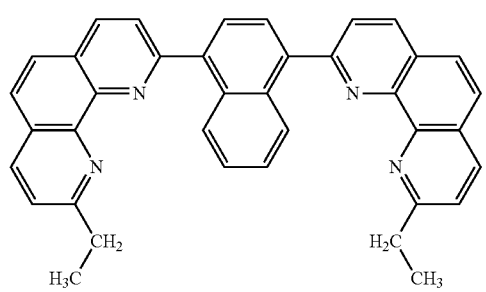
E-39
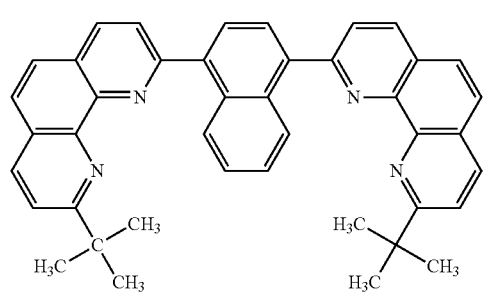
E-40
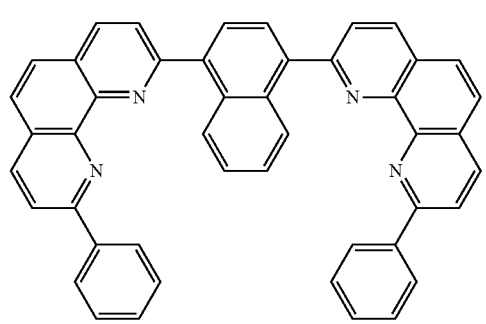
E-41
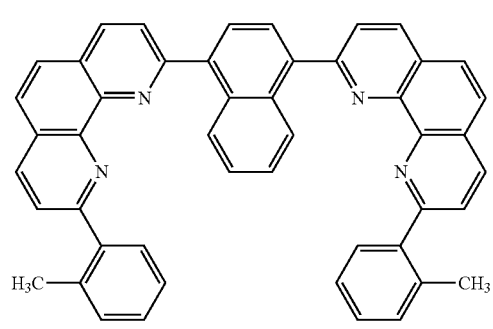
E-42
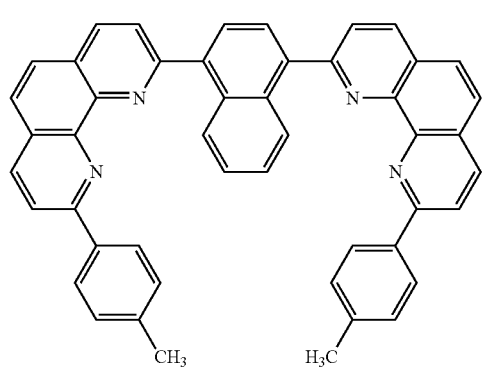

-continued
E-43
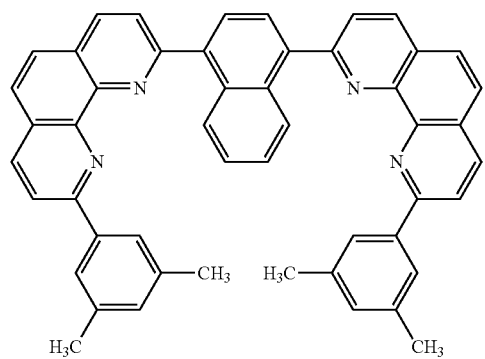
E-44
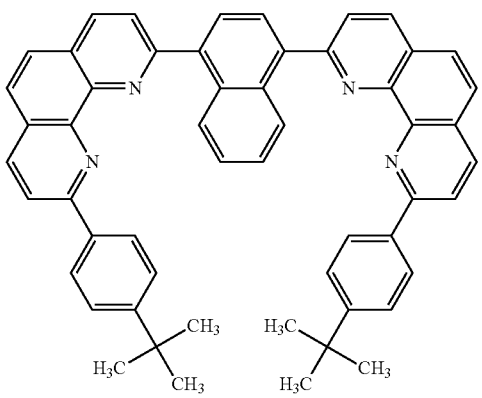
E-45
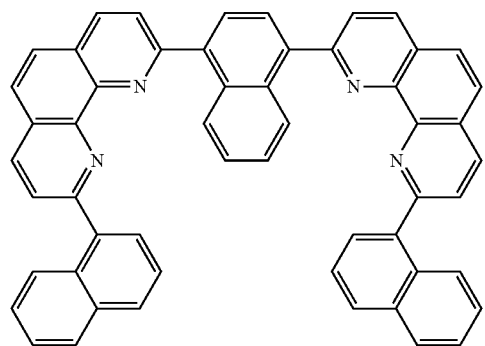
E-46
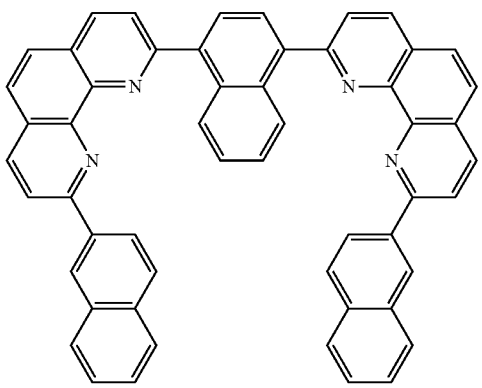
E-47
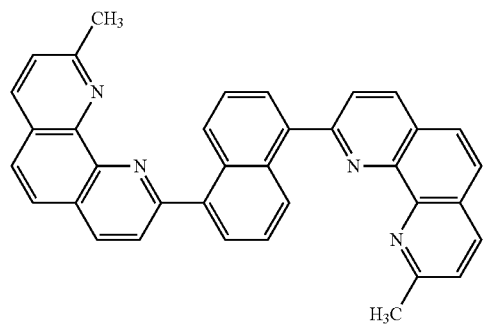
E-48
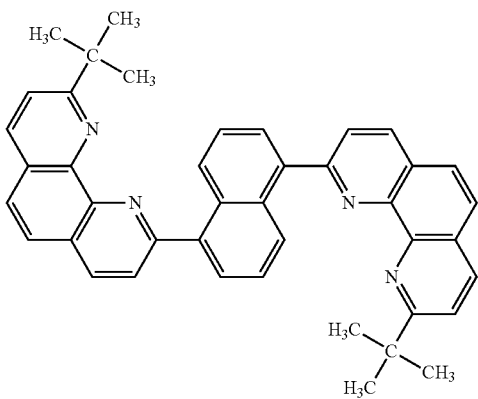

-continued
E-49
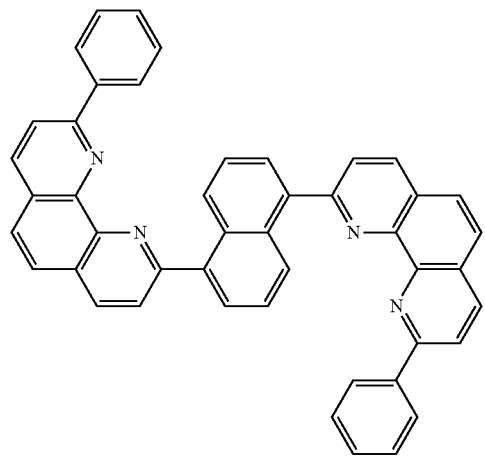
E-50
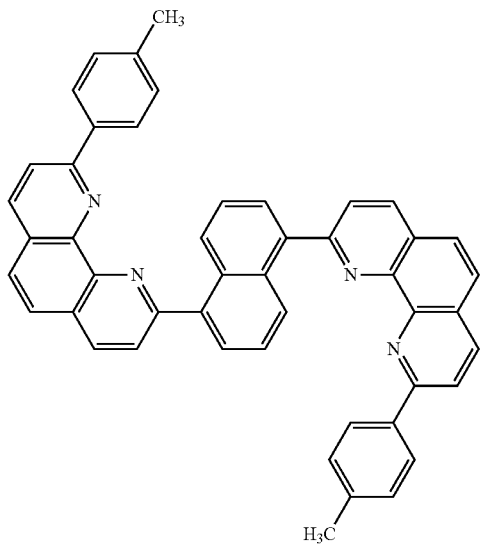
E-51
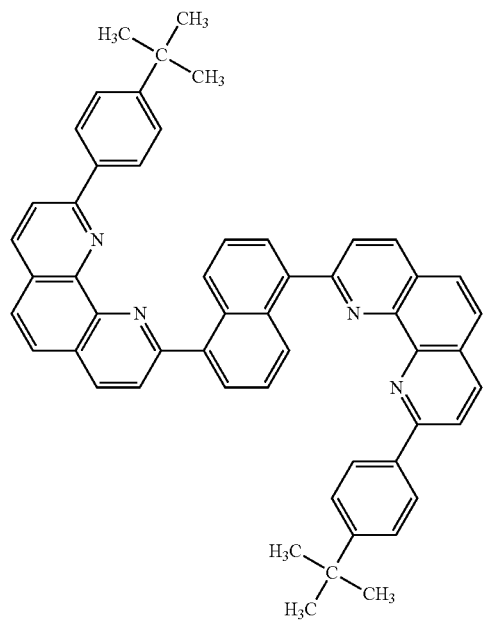
E-52
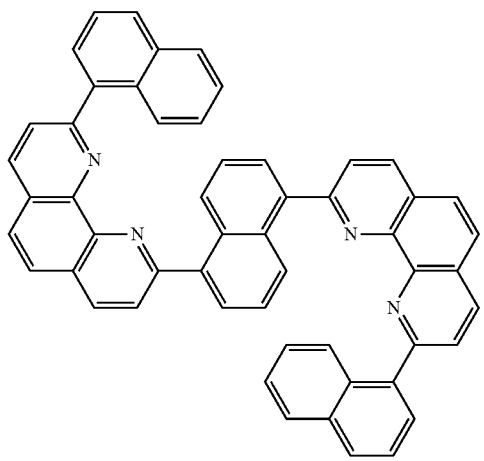

-continued
E-53
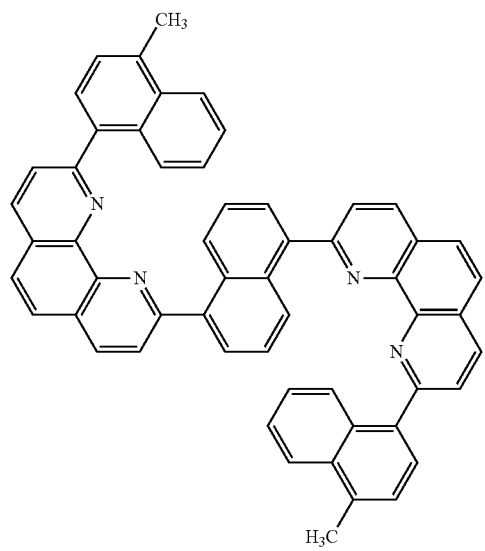
E-54
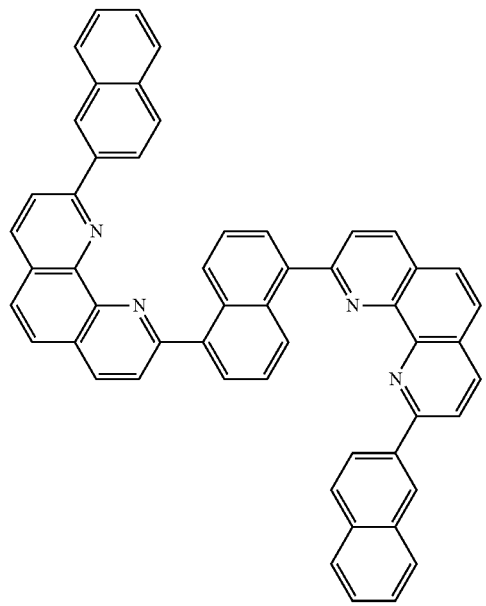
E-55
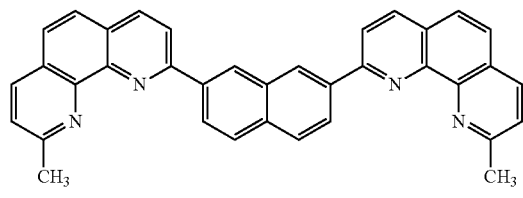
E-56
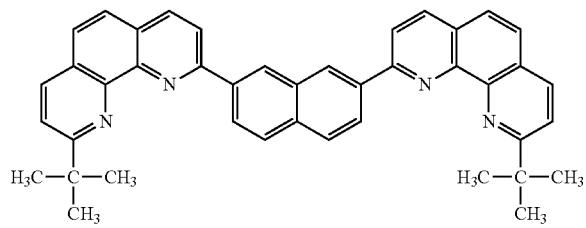
E-57
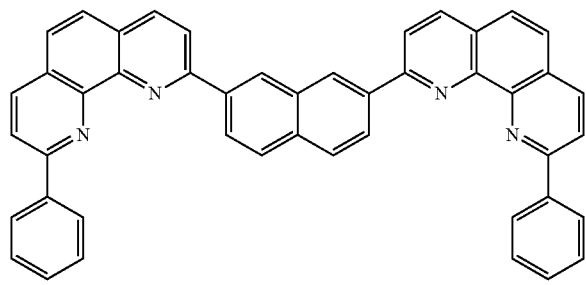
E-58
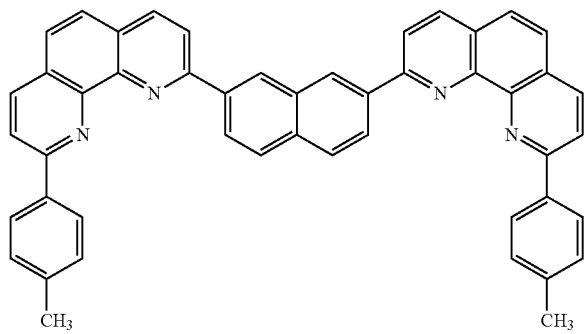
E-59
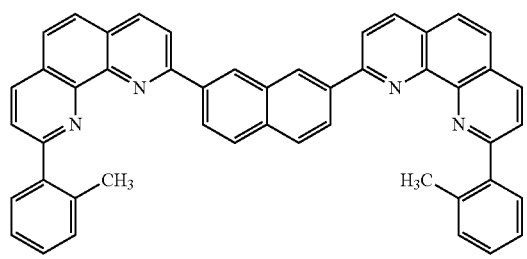
E-60
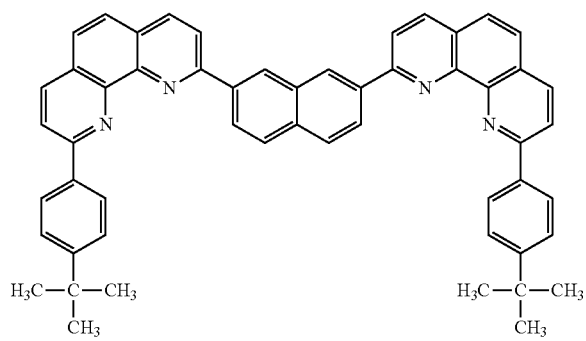

-continued
E-61
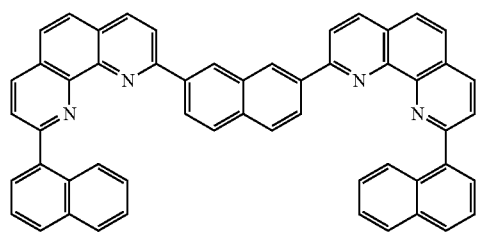
E-62
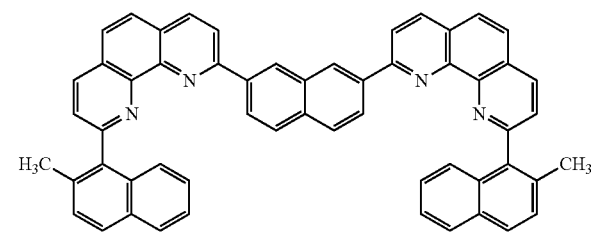
E-63
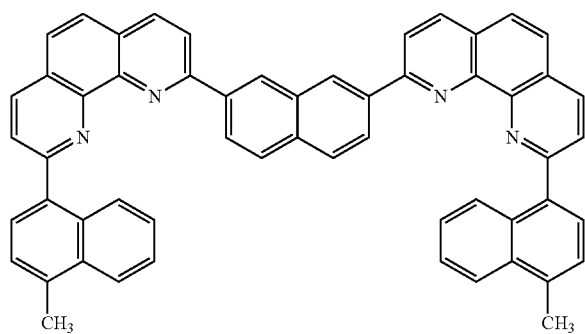
E-64
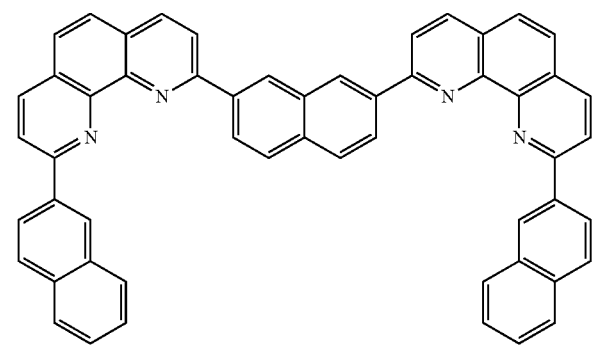
E-65
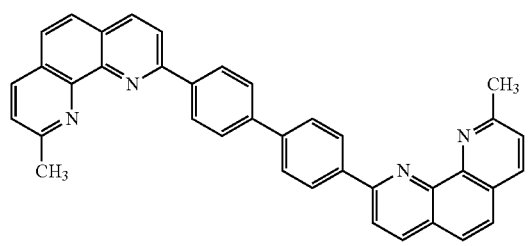
E-66
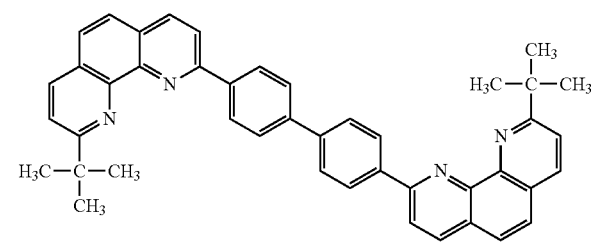
E-67
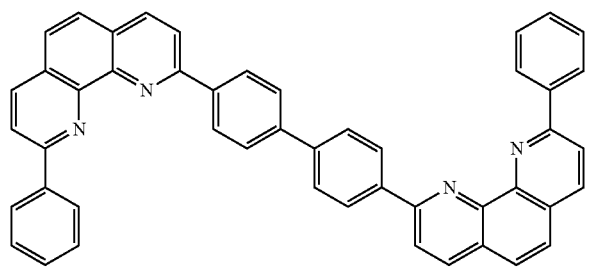
E-68
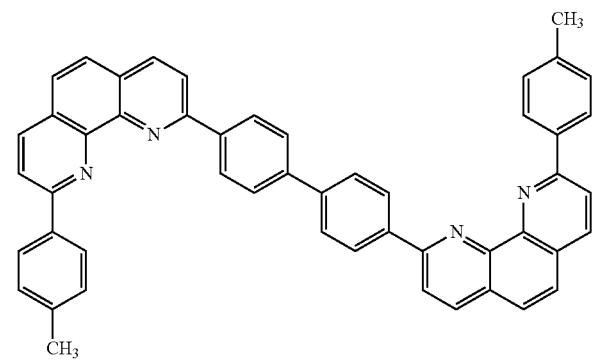

-continued
E-69
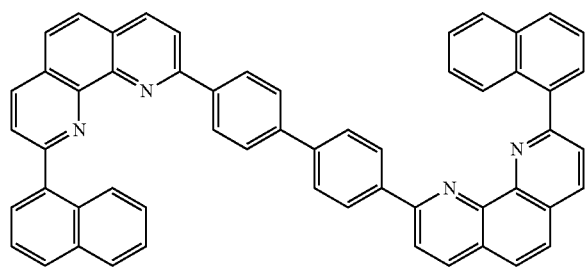
E-70
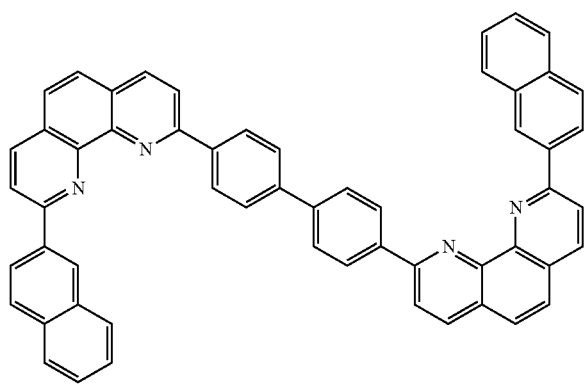
E-71
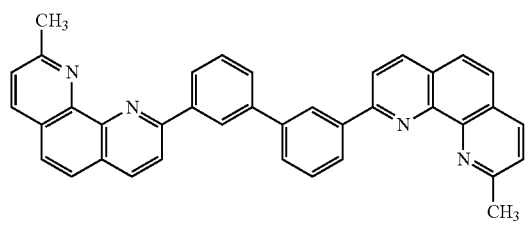
E-74
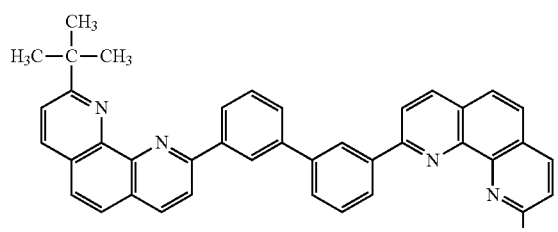
E-71
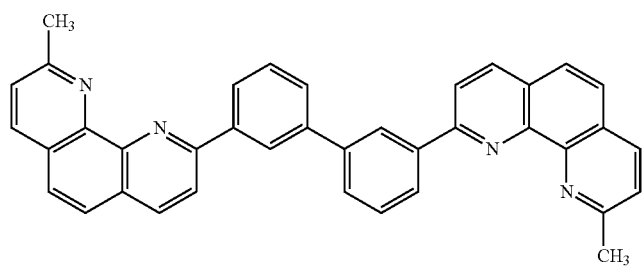

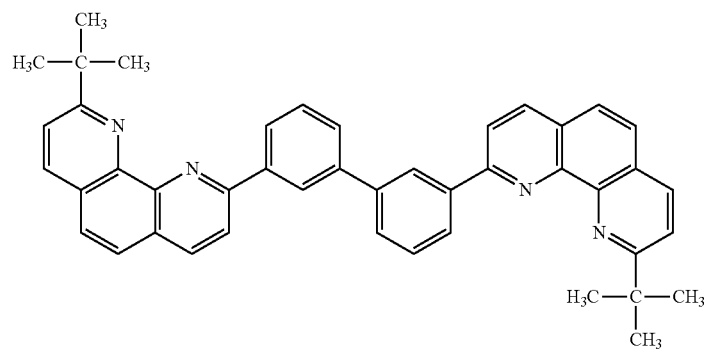
E-72
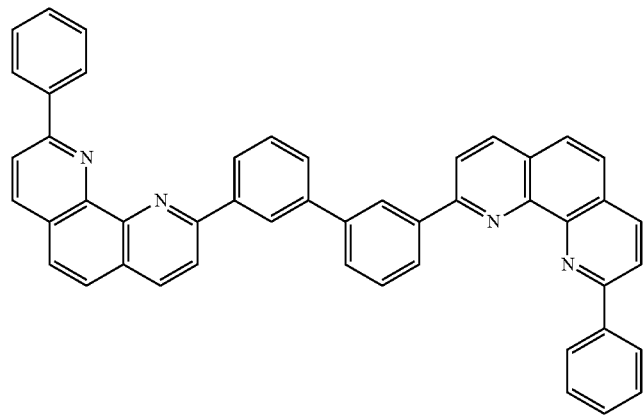
E-73
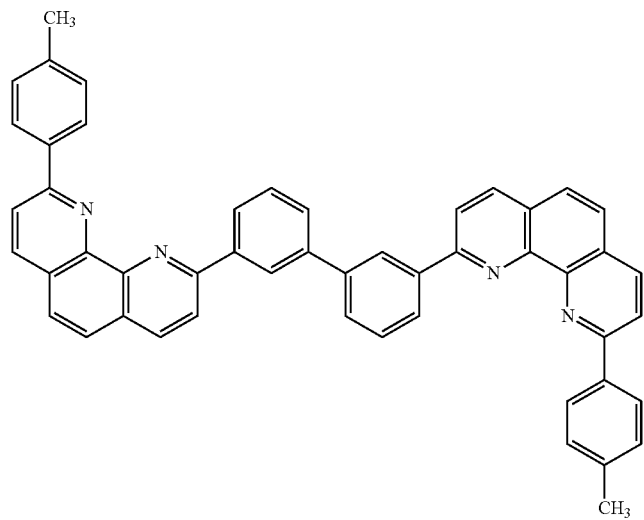
E-74

-continued
E-75
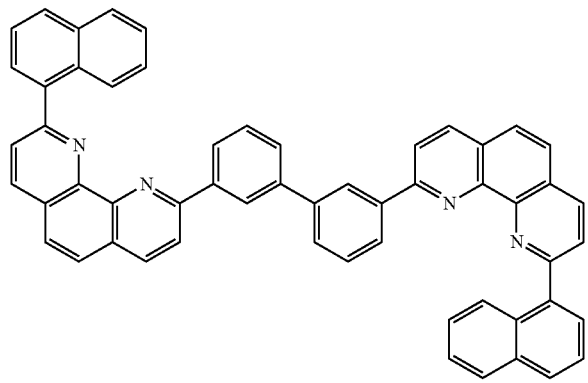
E-76
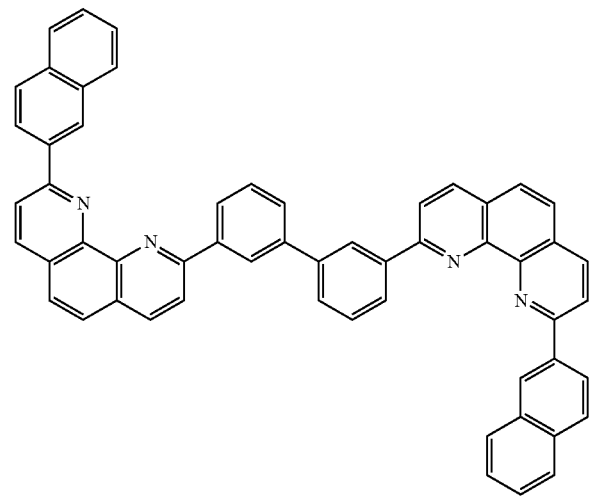
E-77
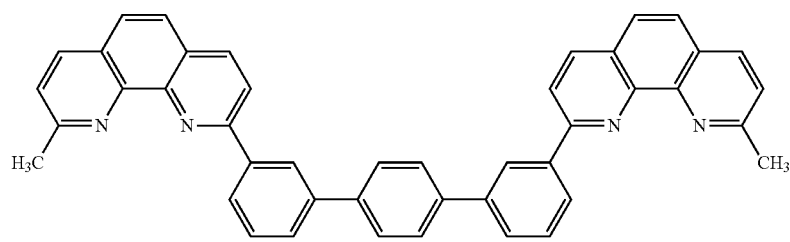
E-78
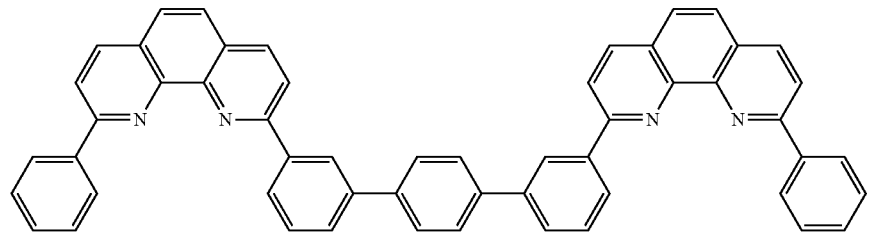
E-79
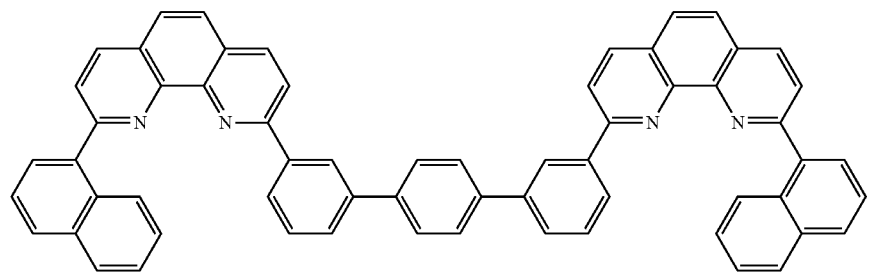
E-80
E-81
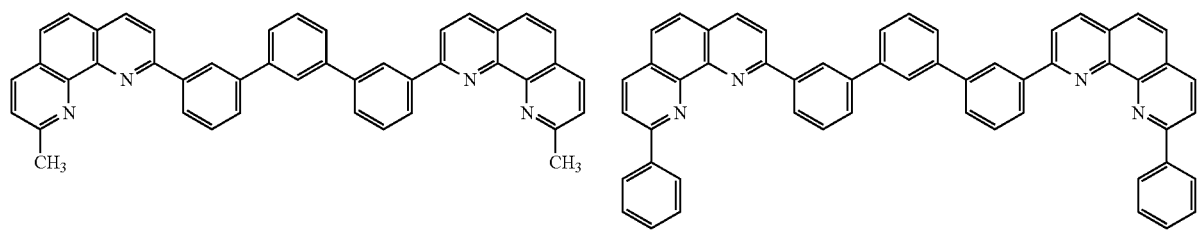

-continued
E-82 E-83
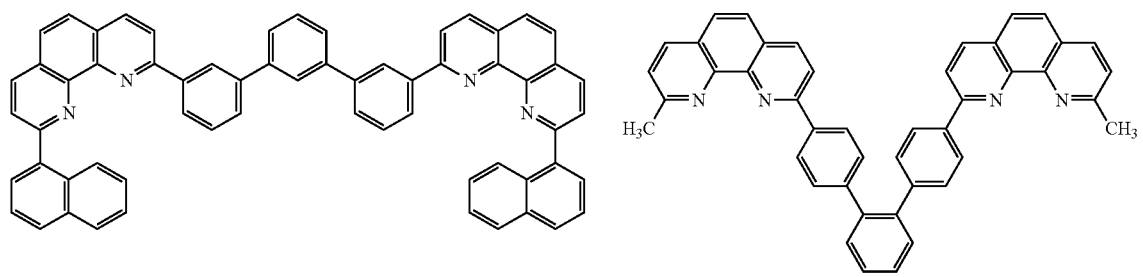
E-84 E-85
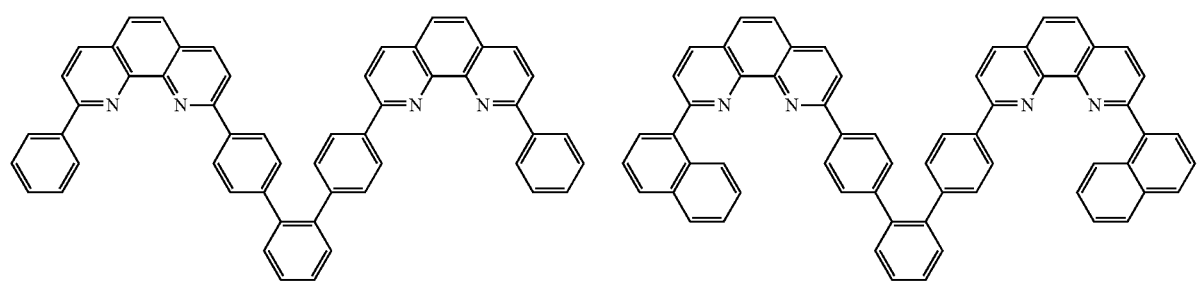
E-86 E-87
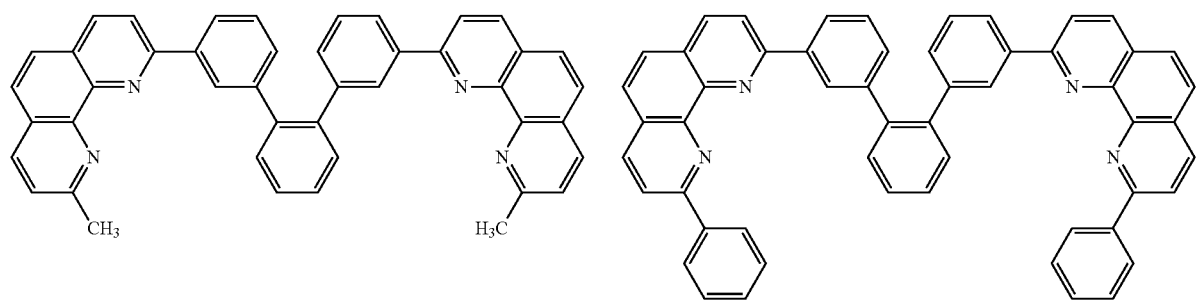
E-88 E-89
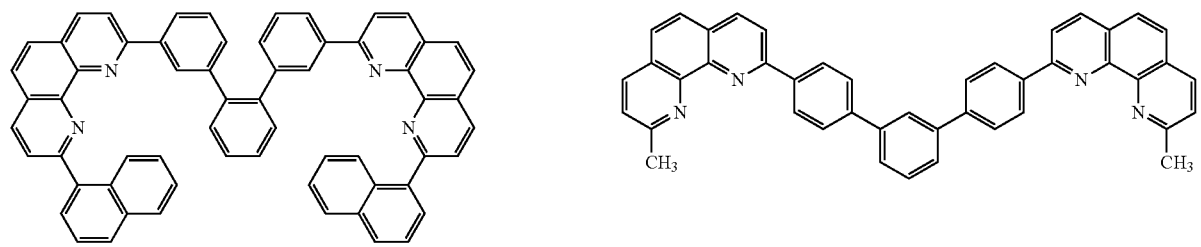
E-90 E-91
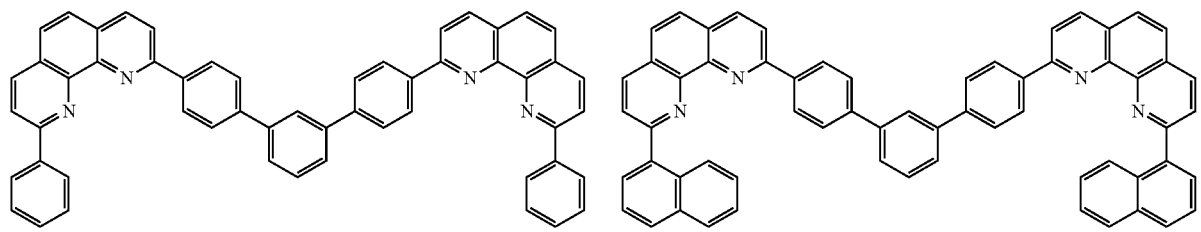

-continued
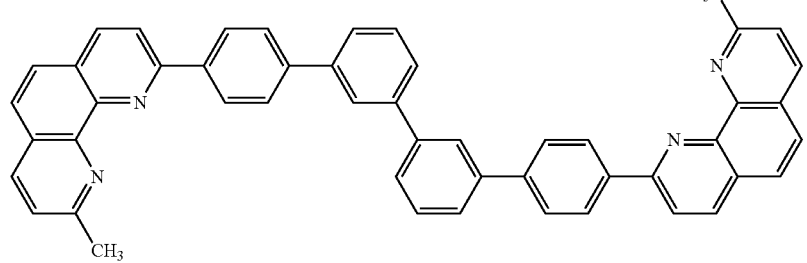
E-92
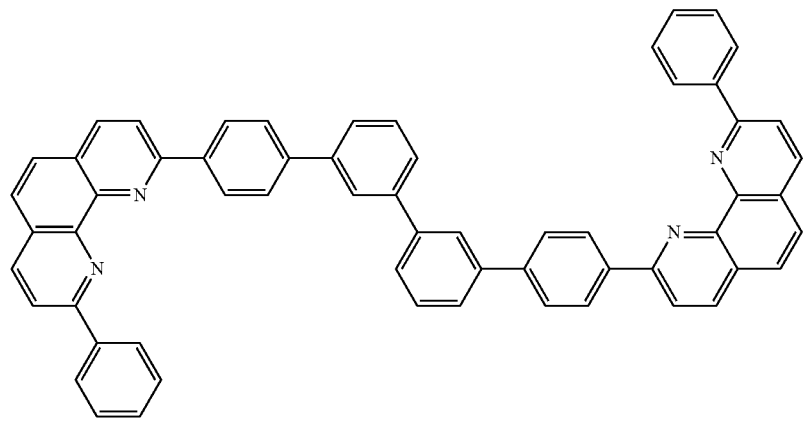
E-93
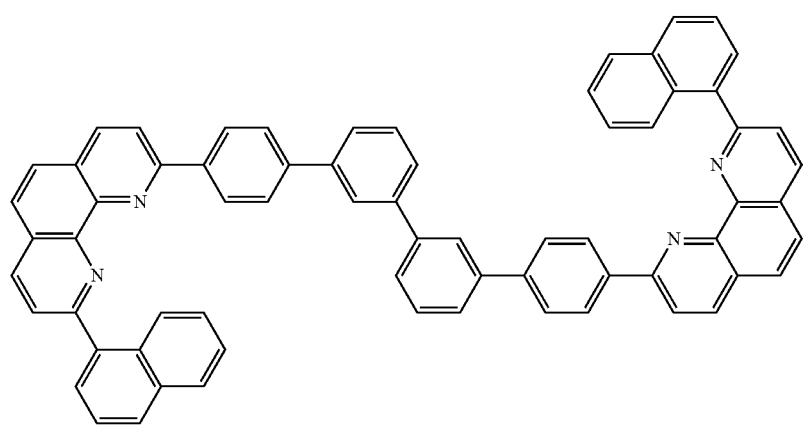
E-94
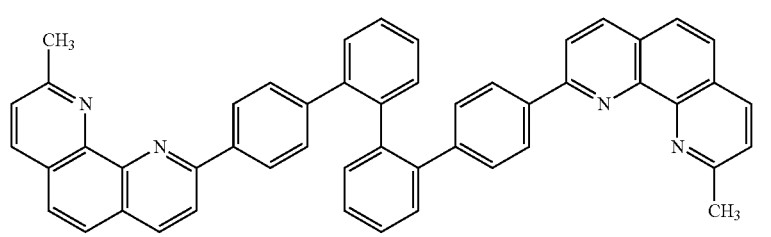
E-95
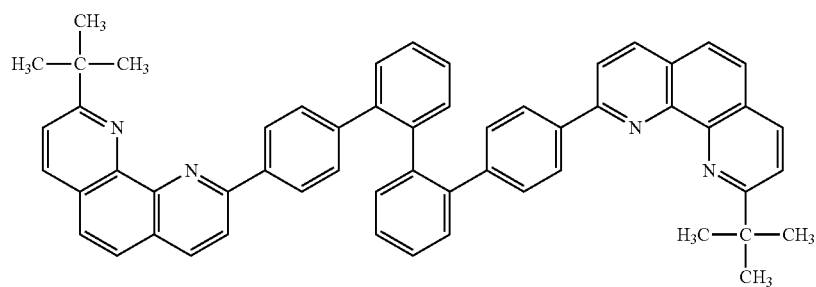
E-96

-continued
E-97
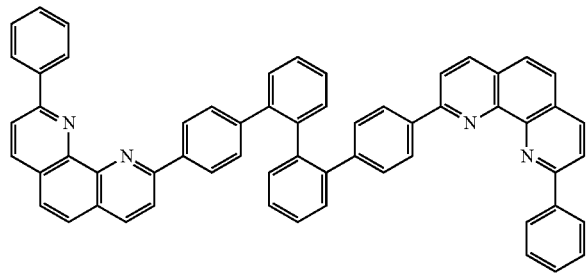
E-98
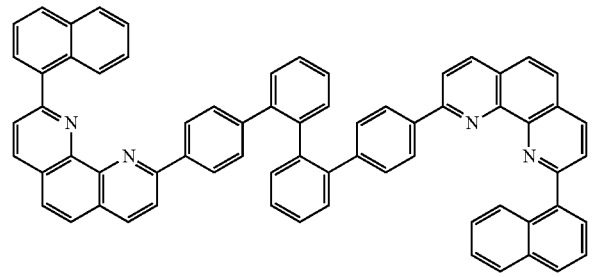
E-99
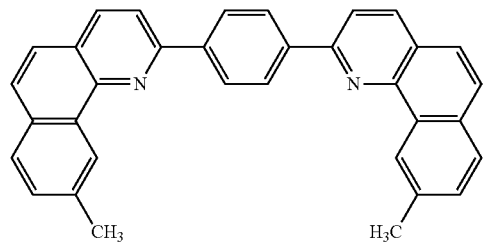
E-100
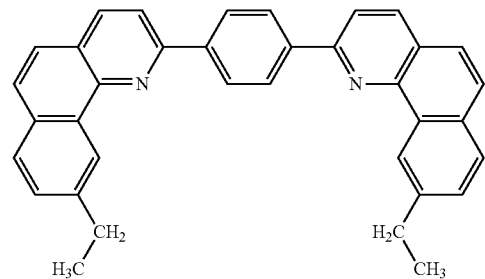
E-101
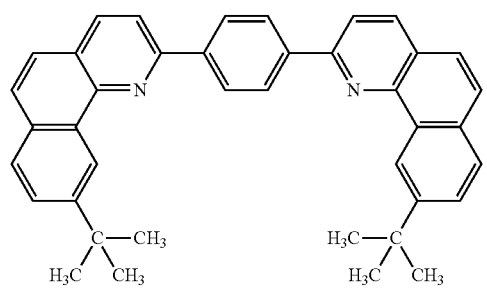
E-102
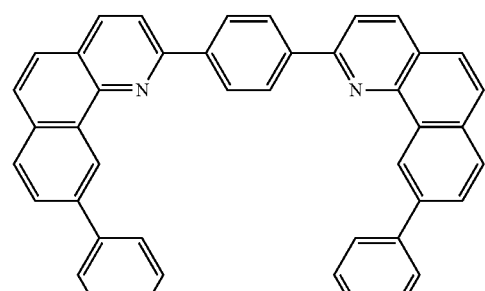
E-103
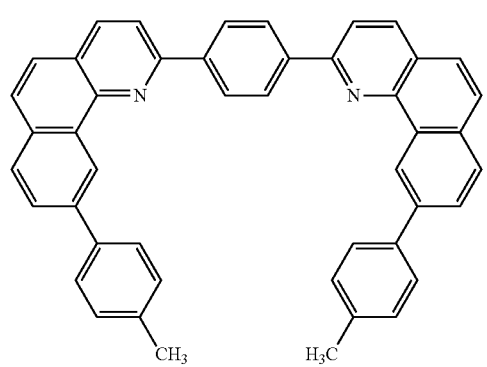
E-104
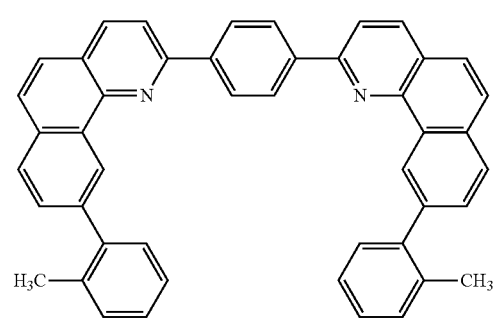
E-105
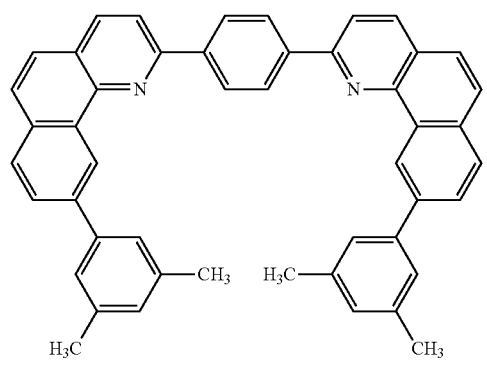
E-106
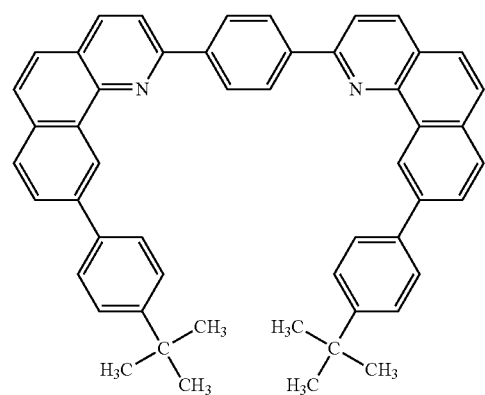

-continued
E-107
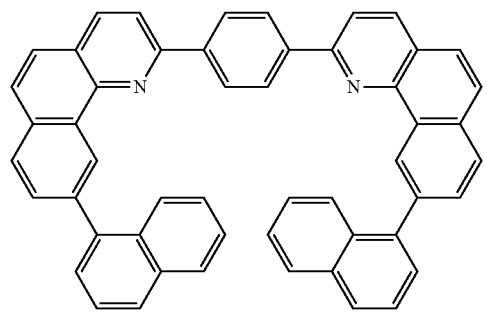
E-108
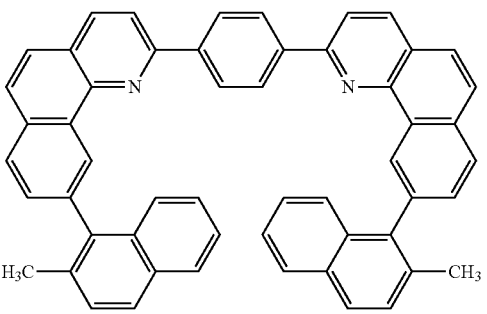
E-109
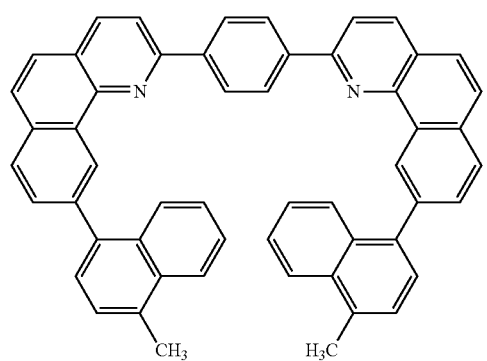
E-110
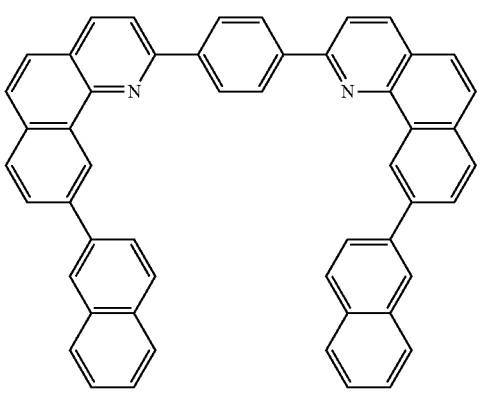
E-111
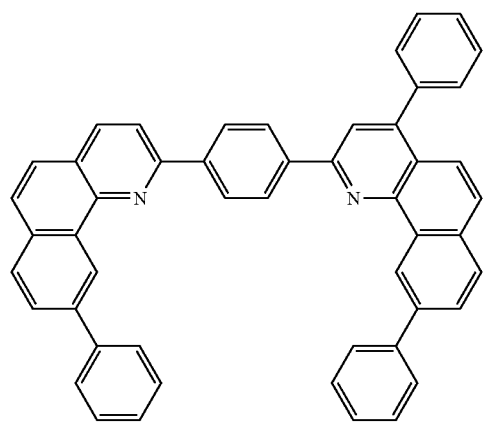
E-112
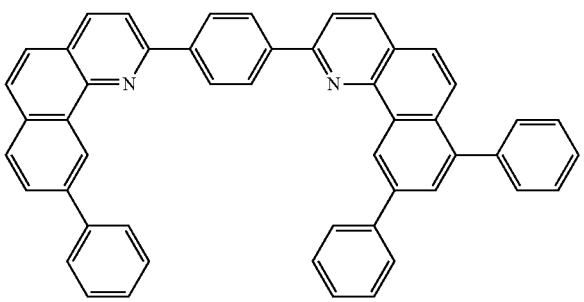
E-113
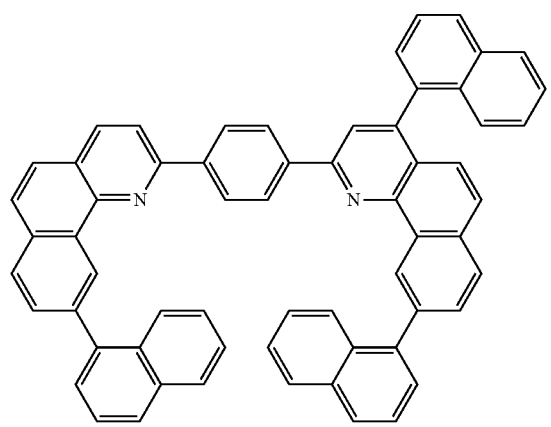
E-114
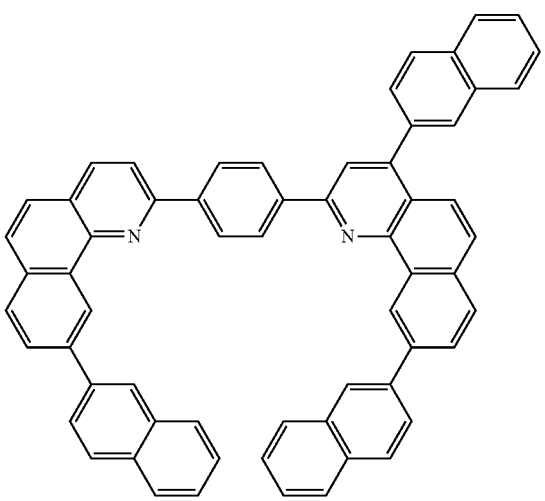

-continued
E-115
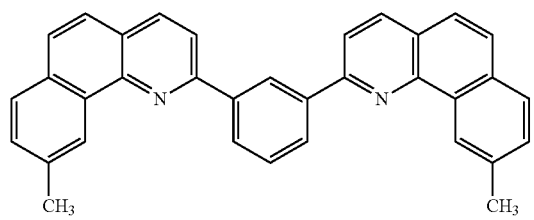
E-116
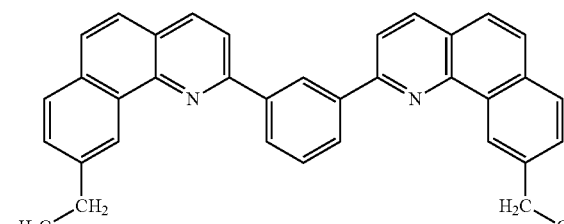
E-117
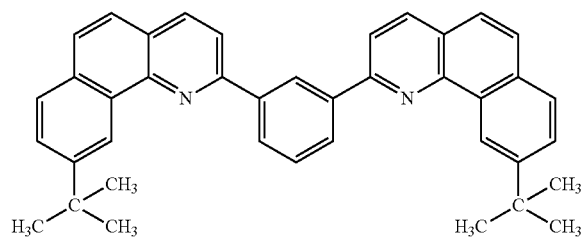
E-118
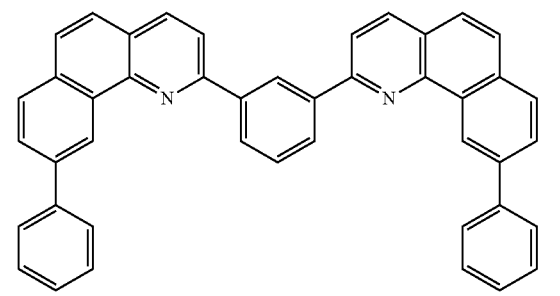
E-119
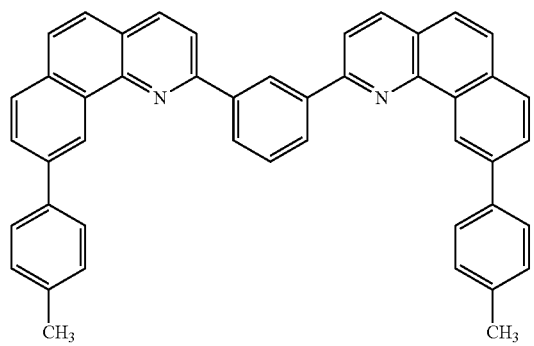
E-120
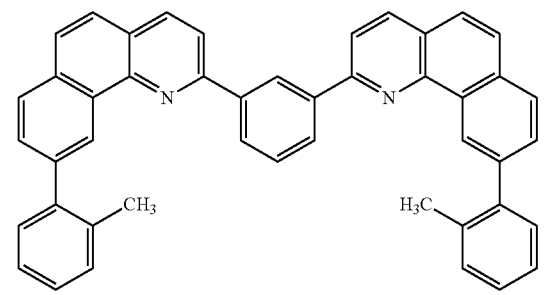
E-121
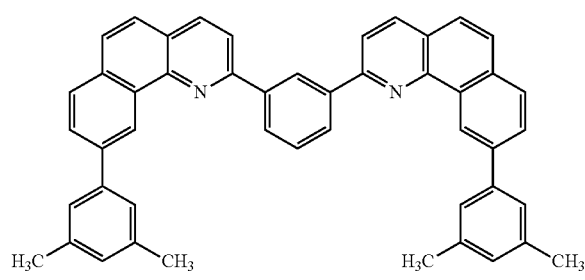
E-122
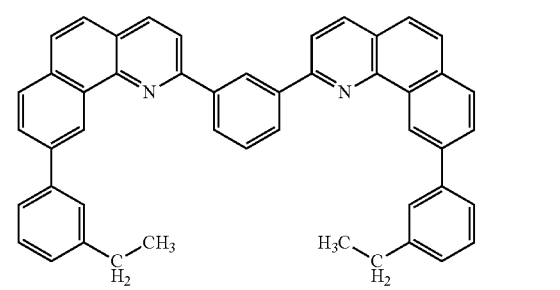
E-123
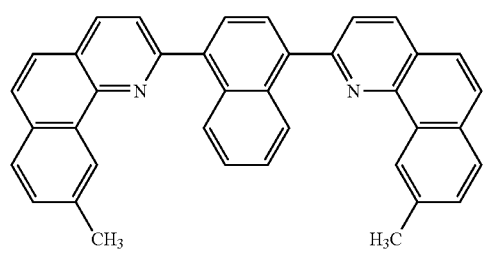
E-124
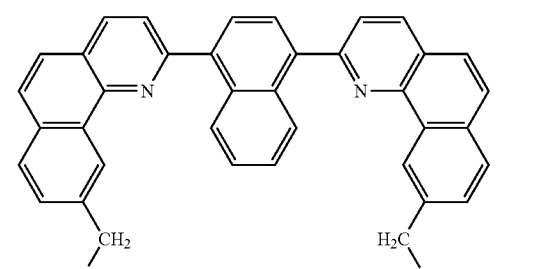

-continued
E-125
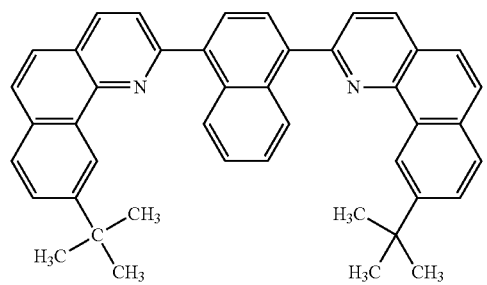
E-126
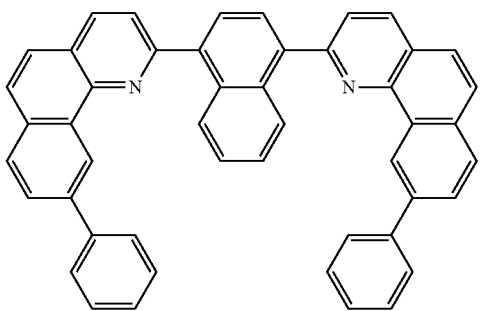
E-127
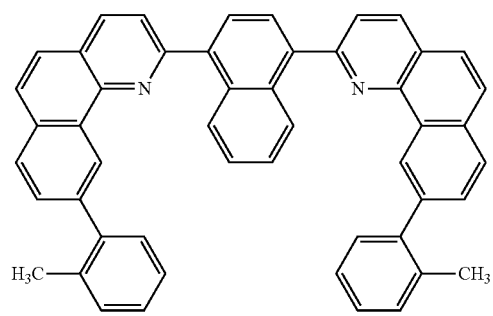
E-128
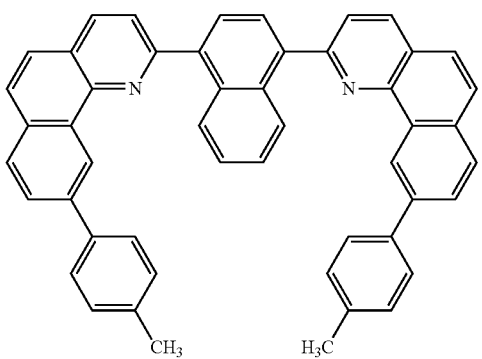
E-129
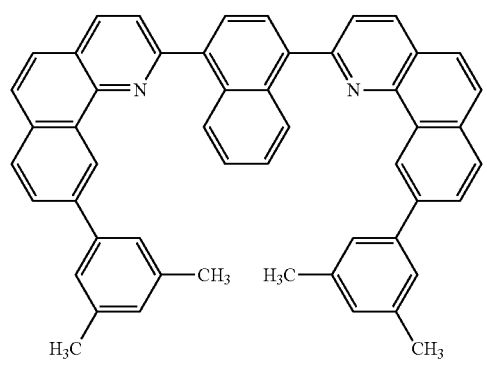
E-130
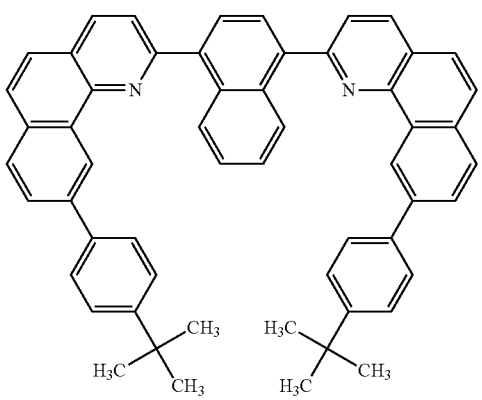
E-131
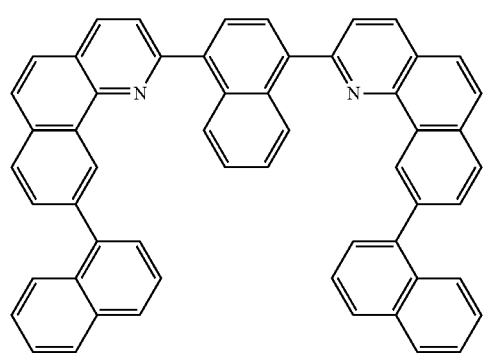
E-132
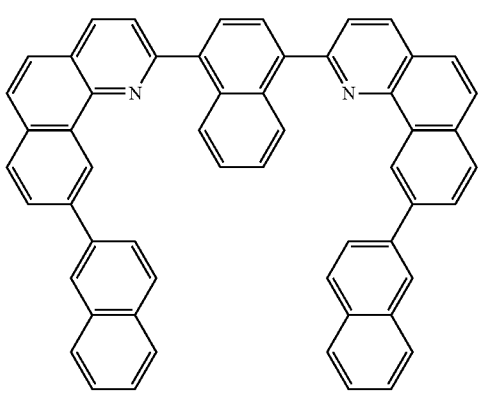

-continued
E-133
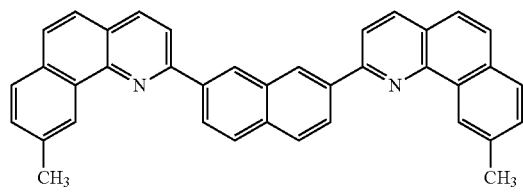
E-134
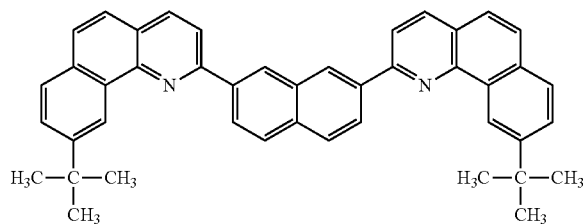
E-135
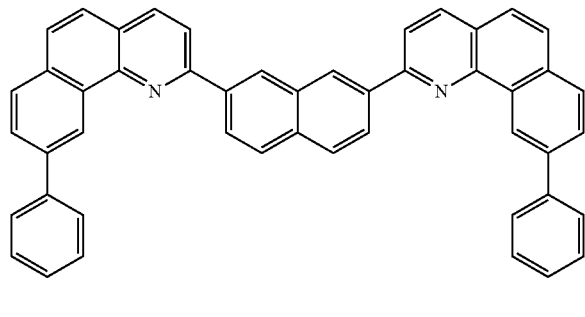
E-136
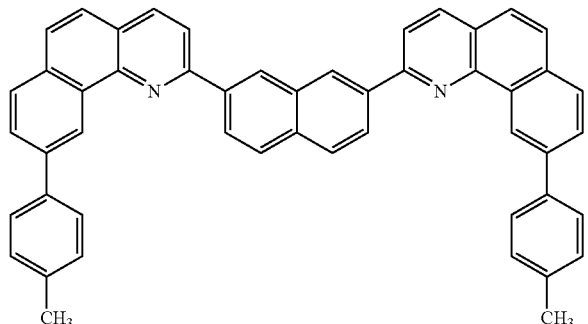
E-137
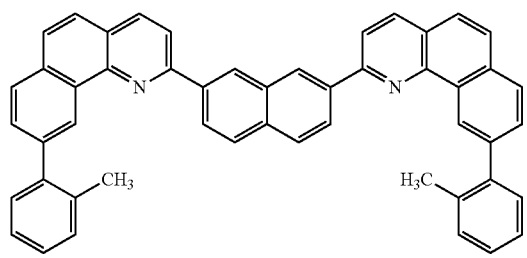
E-138
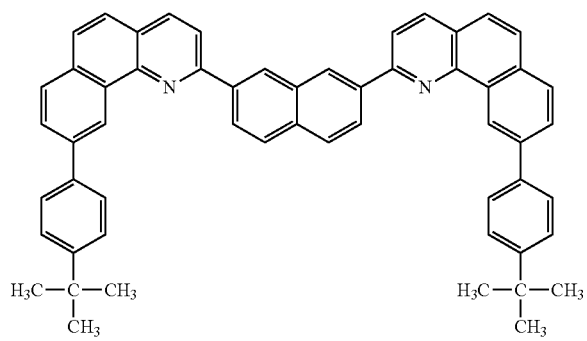
E-139
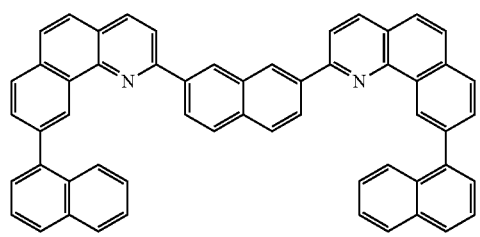
E-140
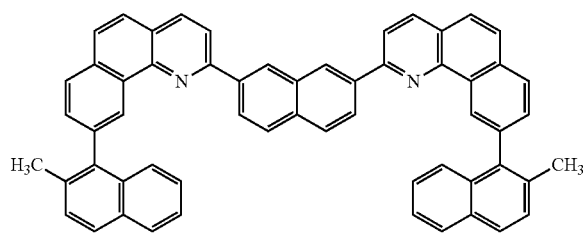
E-141
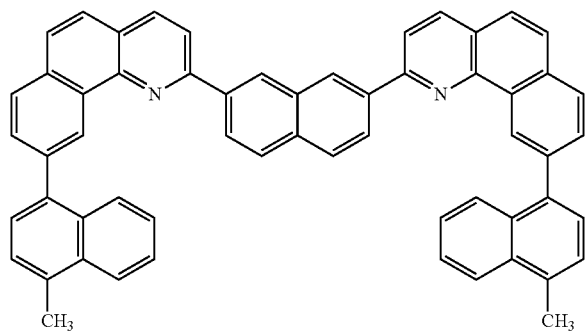
E-142
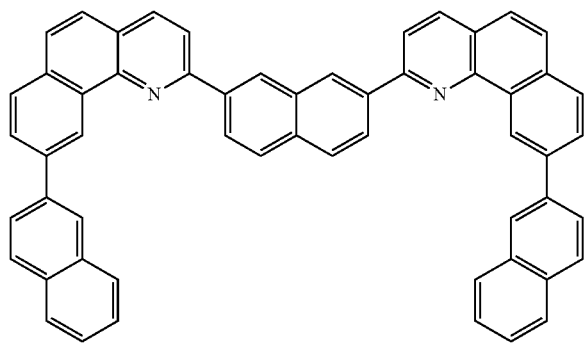

-continued
E-143
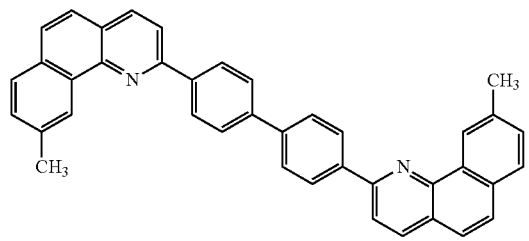
E-144
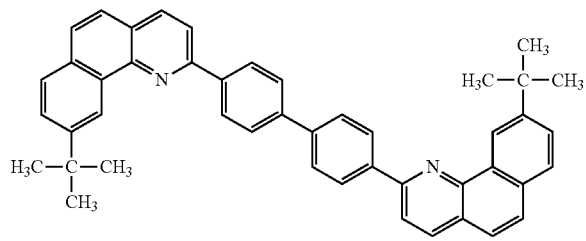
E-145
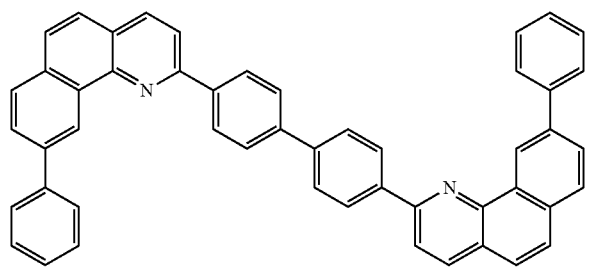
E-146
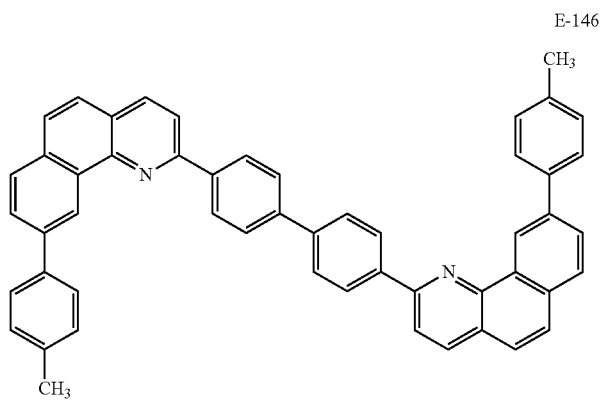
E-147
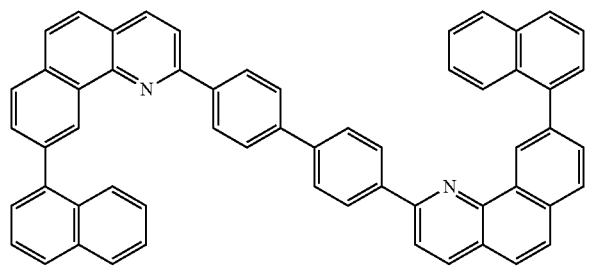
E-148
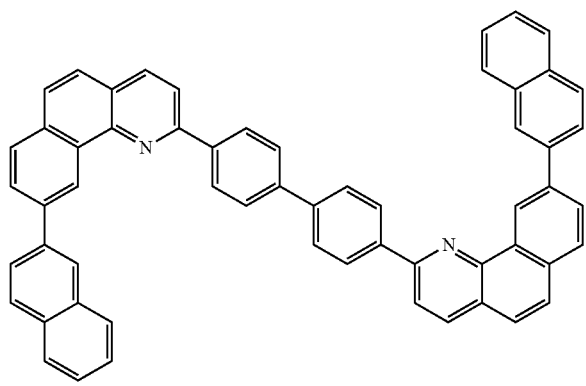
E-149
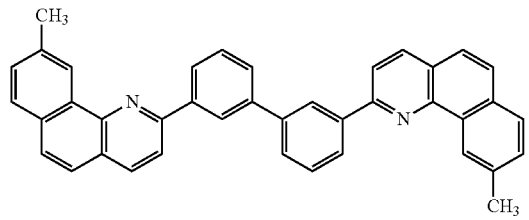
E-150
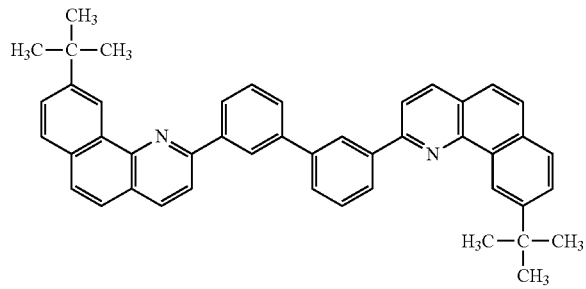

-continued
E-151
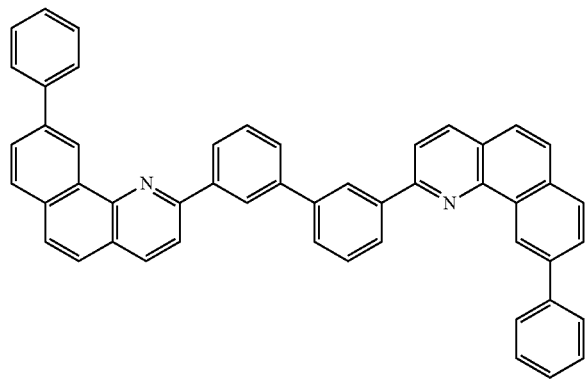
E-152
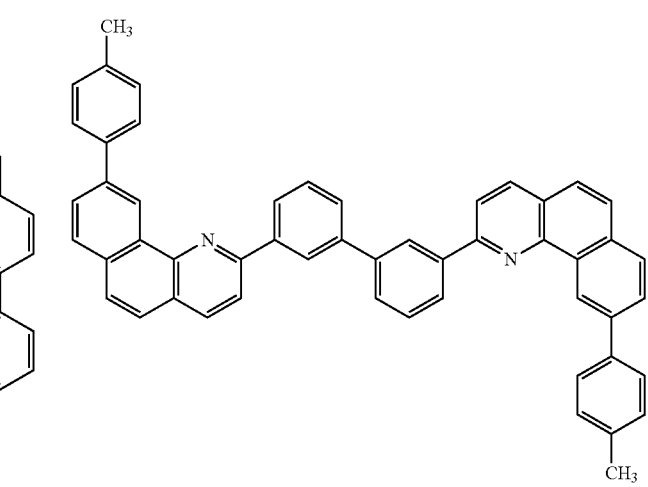
E-153
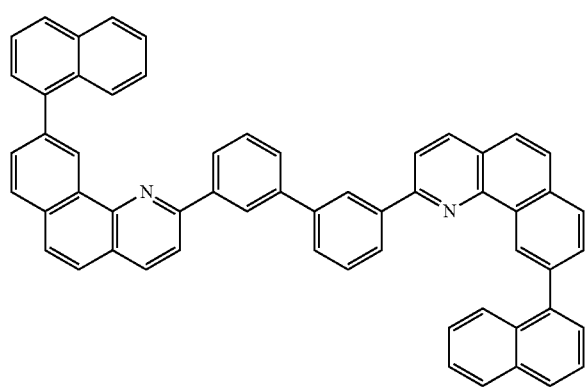
E-154
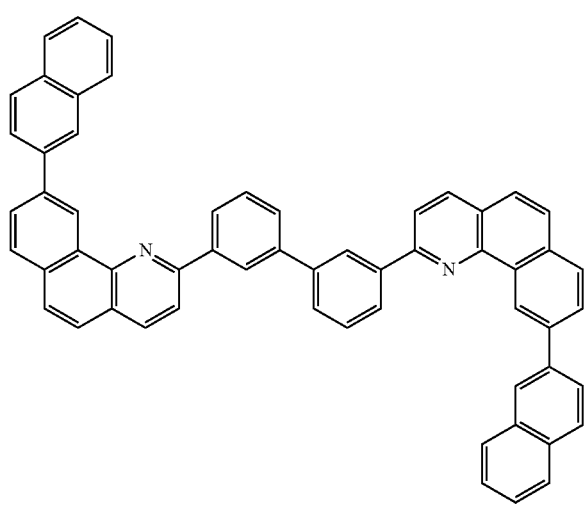
E-155
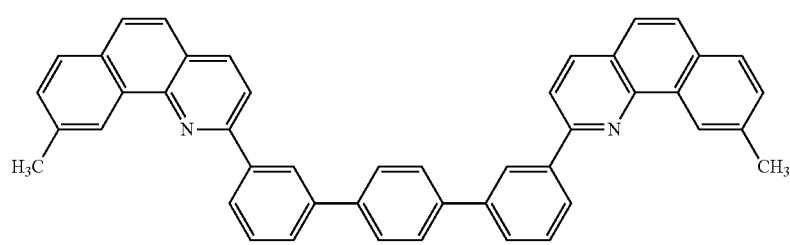
E-156
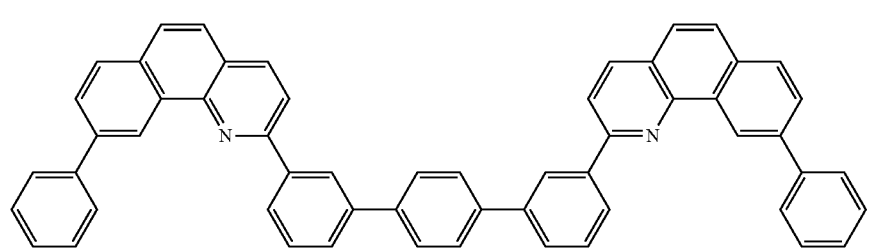

-continued
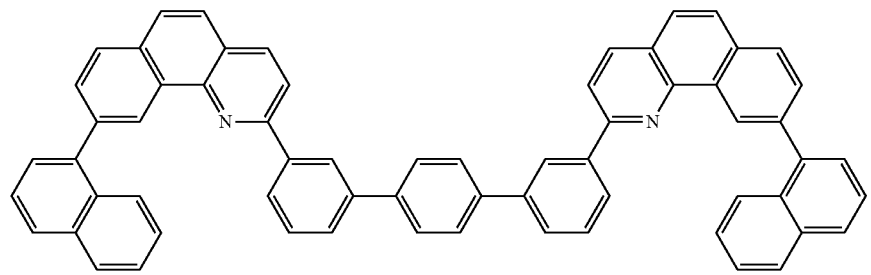
E-157
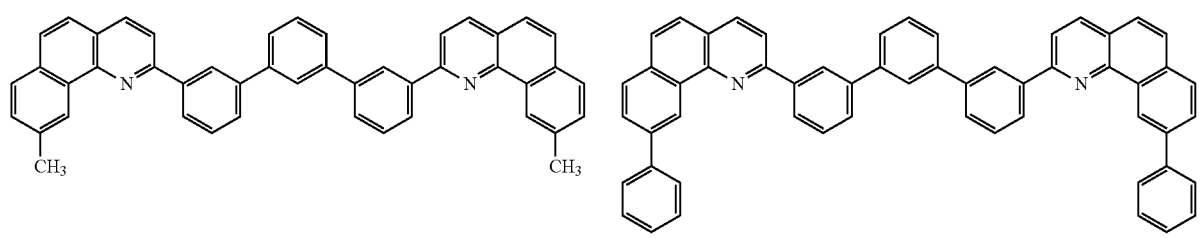
E-158  E-159
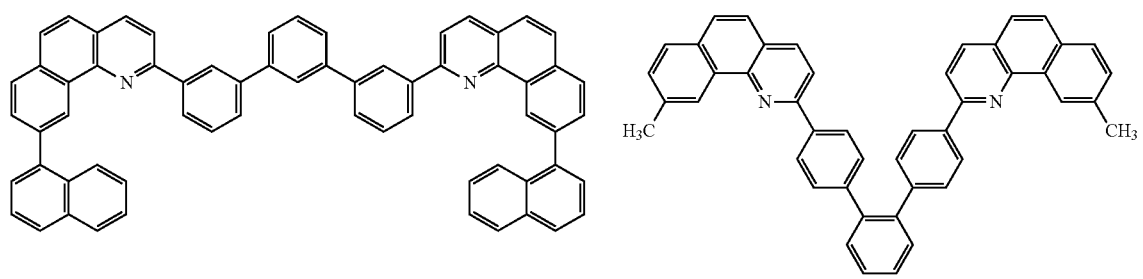
E-160  E-161
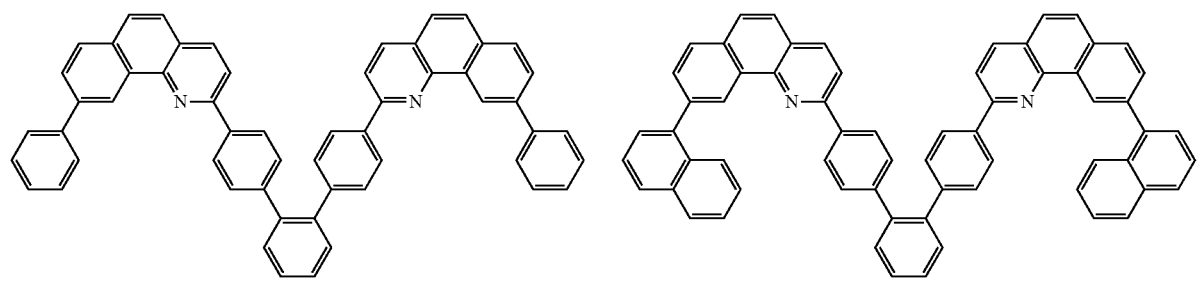
E-162  E-163
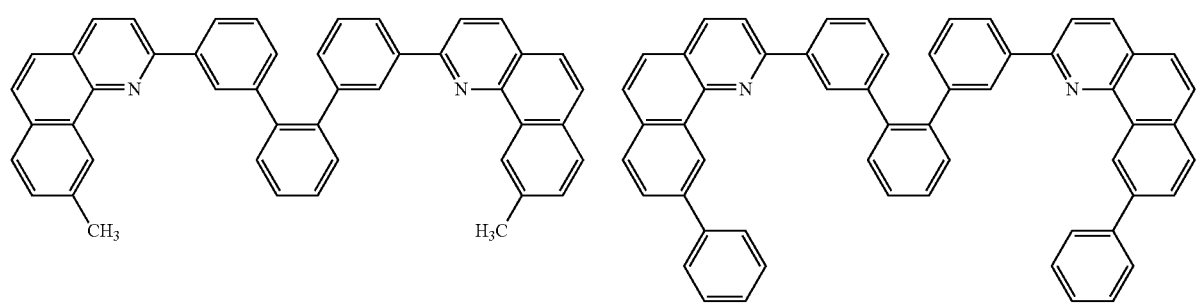
E-164  E-165

-continued
E-166
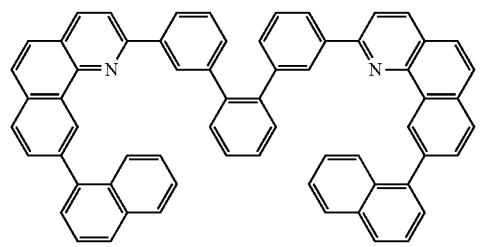
E-167
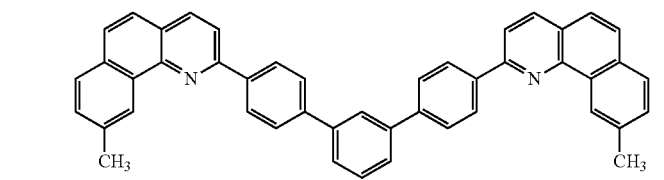
E-168
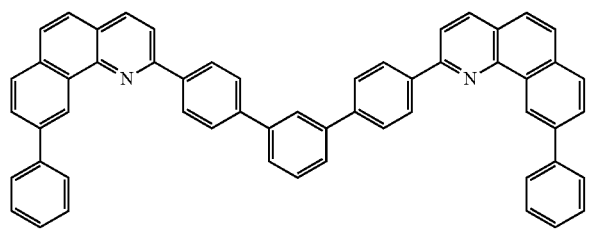
E-169
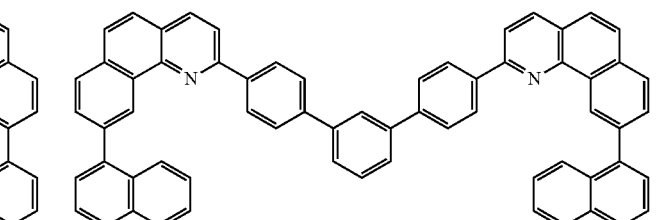
E-170
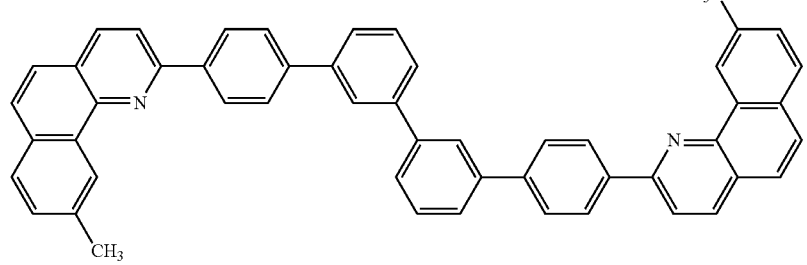
E-171
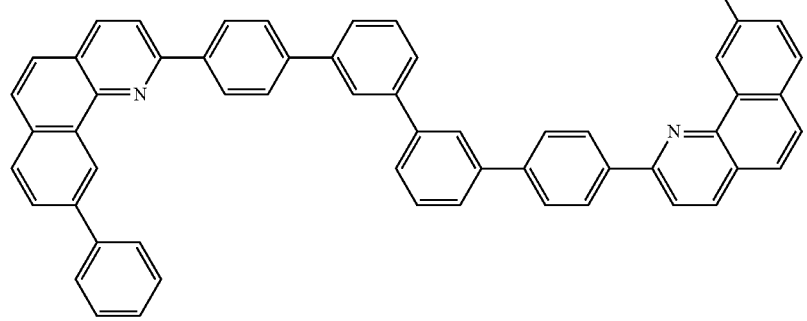
E-172
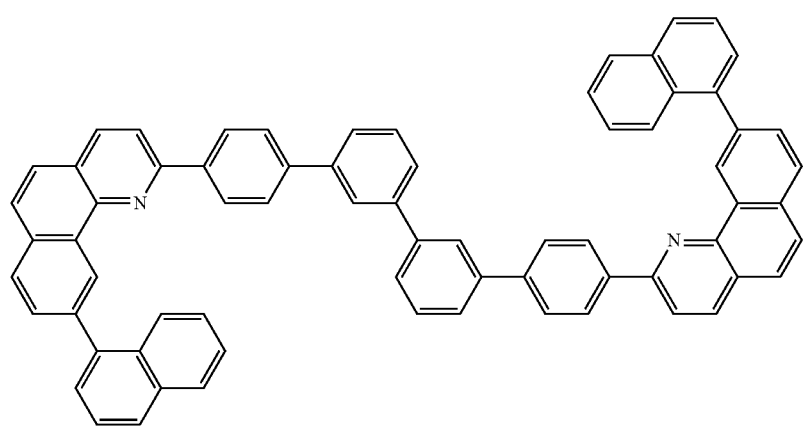

E-173
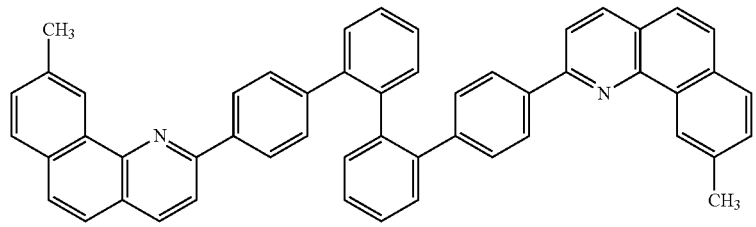
E-174
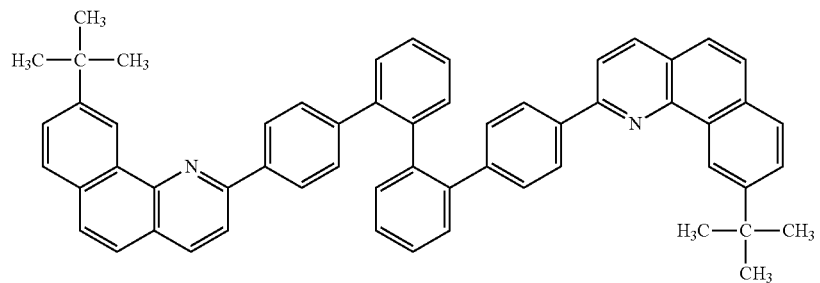
E-175 E-176
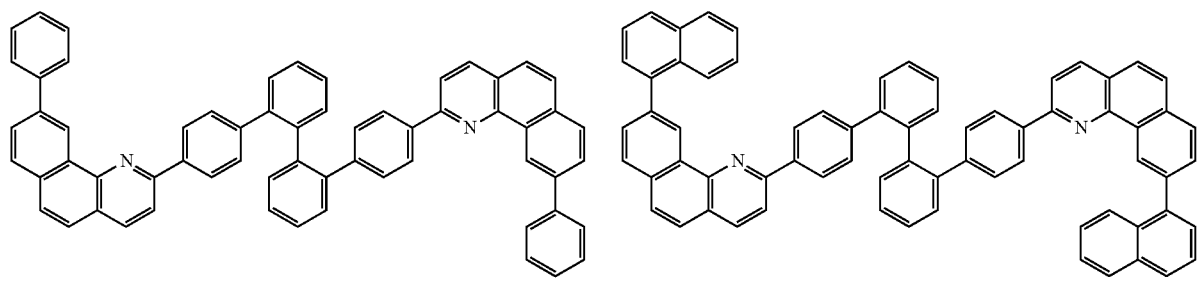
E-177
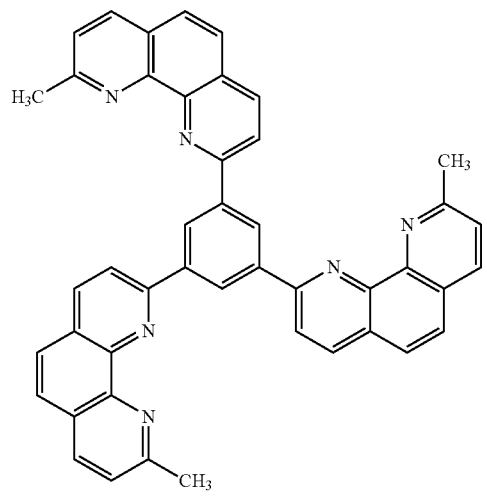
E-178
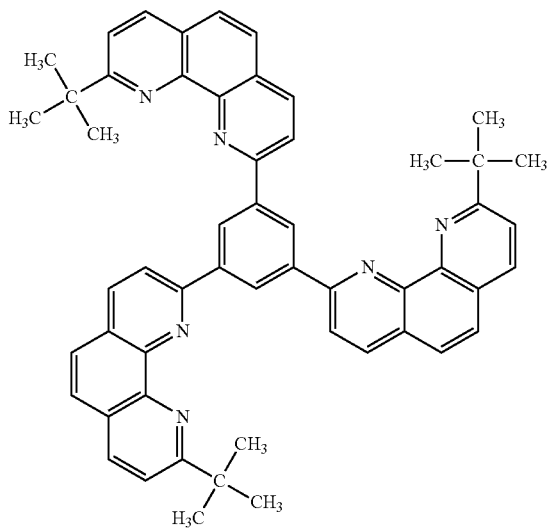

-continued
E-179
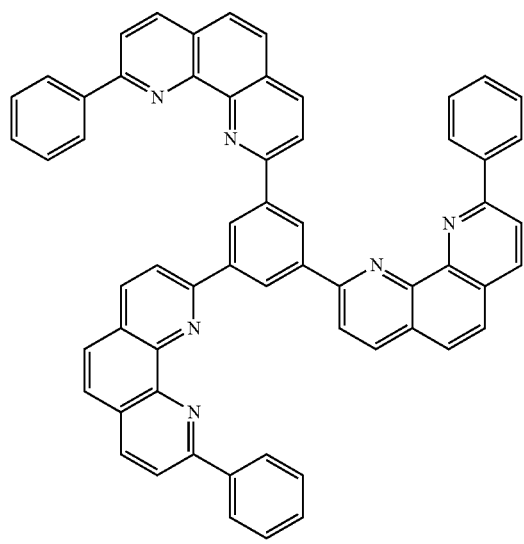
E-180
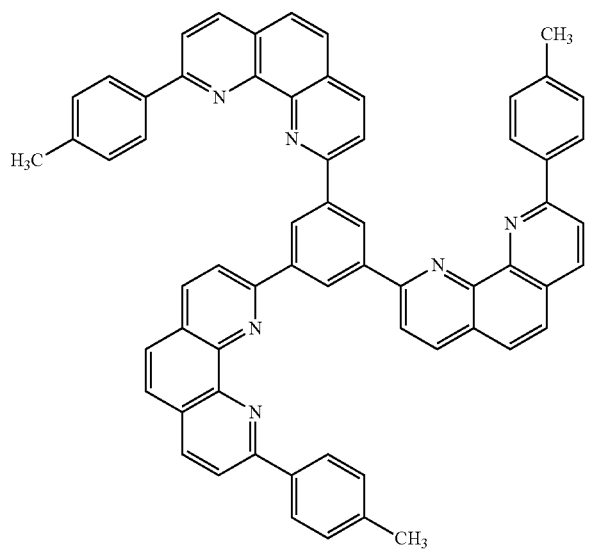
E-181
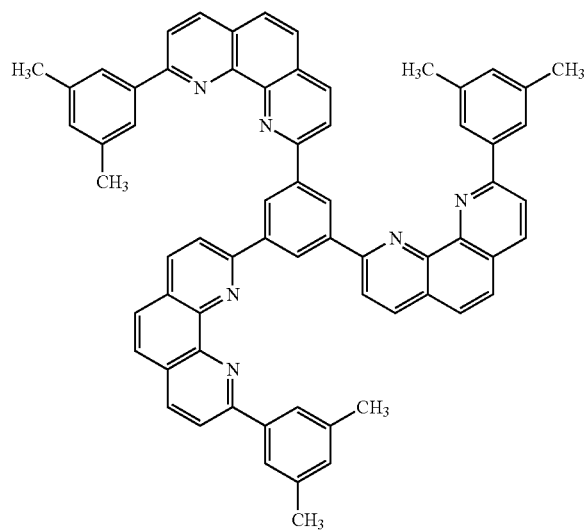
E-182
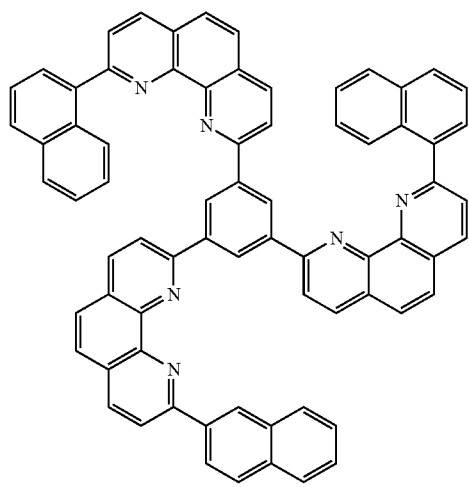

E-183

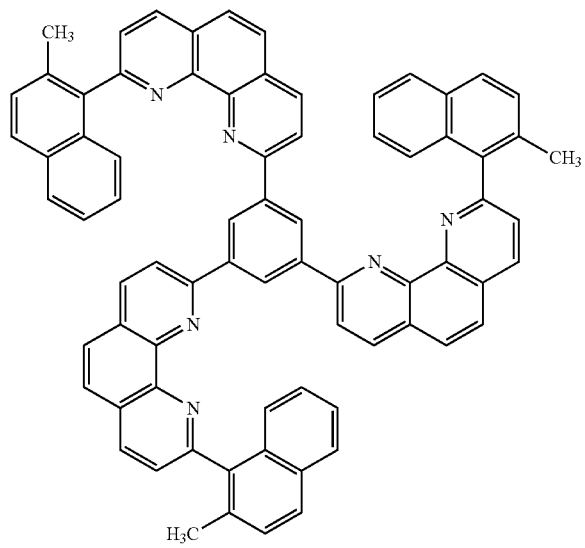

E-184

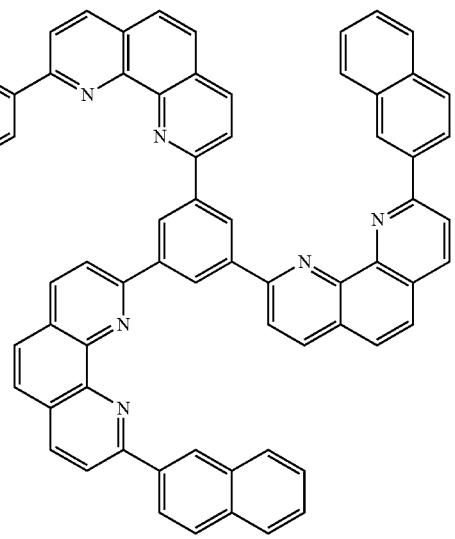

The material for a light emitting device expressed by the general formula (1) can be synthesized by the following methods, but it is not particularly limited.

As a method of obtaining the material for a light emitting device expressed by the general formula (1), a method, in which a reactive substituent is introduced to a compound corresponding to A in the general formula (1) and then the resulting compound is converted to the phenanthroline skeleton or the benzoquinoline skeleton of the general formula (1) to obtain a compound in which B in the general formula (1) is hydrogen and next B is introduced, is preferred.

Here, examples of the reactive substituent include an acetyl group, an iodine group and a bromo group, but it is not particularly limited.

Examples of a method of introducing the acetyl group include acylation of Friedel-Crafts. The literatures on this method include "Example A. A starting compound (f) 2,2'-diacetyl-9,9'-spirobifluorene" in p 27 of Japanese Unexamined Patent Publication No. 7-278537 and "Experimenteller Tell 2,2'-diacetyl-9,9'-spirobifluorene (IV)", Helvetica Chimica Acta, vol. 52 (1969), p 1210. Specifically, it is possible to introduce an acetyl group by reacting a compound corresponding to A in the general formula (1) with acetyl chloride and aluminum chloride in 1,2-dichloroethane at a temperature of 50° C. and treating a reactant by a normal method. A mono-, di-, tri-, or tetra-substitution can be obtained by changing the equivalent weights of acetyl chloride and aluminum chloride.

Further, alternatively, a method of converting a trifluoromethane sulfonyloxy group to an acetyl group by a palladium catalyst can also be employed. Examples of the literatures on this method include J. Org. Chem. vol. 57, 1992, p 1481. Specifically, it is possible to introduce an acetyl group by reacting a compound corresponding to A in the general formula (1), having a trifluoromethane sulfonyloxy group, with butyl vinyl ether in dimethylformamide and triethylamine at a temperature of 50° C. to 120° C. in the presence of a palladium catalyst and treating a reactant by a normal method. In this method, it is also possible to introduce the acetyl group by using a bromo group or an iodine group in place of a trifluoromethane sulfonyloxy group.

Examples of the literatures on a method of introducing the iodine group include Tetrahedron Letters, vol. 38 (1997) p 1487. Specifically, it is possible to introduce the iodine group by reacting a compound corresponding to A in the general formula (1) with iodine and bis(trifluoroacetoxy)iodobenzene in carbon tetrachloride at a temperature of 50° C. or 60° C. and treating a reactant by a normal method.

Examples of the literatures on a method of introducing the bromo group include Angew. Chem. Int. Ed. Engl. 25 (1986) No. 12, p 1098. Specifically, it is possible to introduce the bromo group by reacting a compound corresponding to A in the general formula (1) with bromine at room temperature and treating a reactant by a normal method. A mono-, di-, tri-, or tetra-substitution can be obtained by changing the equivalent weight of bromine.

Examples of the literatures on a method of converting the above-mentioned reactive substituent to the phenanthroline skeleton or the benzoquinoline skeleton of the general formula (1) include Tetrahedron Letters, vol. 40 (1999) p 7312 (a scheme), "2-Phenyl-1,10-phenanntoroline", J. Org. Chem. Vol. 61, 1996, p 3020, and Tetrahedron Letters, vol. 23 (1982) p 5291-5294. Specifically, it is possible to introduce the phenanthroline skeleton or the benzoquinoline skeleton by a method in which an acetyl body of a compound corresponding to A in the general formula (1) is reacted with 8-amino-7-quinoline carboaldehyde or 1-amino-2-naphthalene carboaldehyde in lower alcohol such as ethanol or isopropylalcohol or dioxane at a temperature of 50° C. to a reflux temperature in the presence of potassium hydroxide and a reactant is treated by a normal method, or a method in which an iodine body or a bromo body of a compound corresponding to A in the general formula (1) is lithiated with metal lithium or alkyllithium such as t-butyl lithium, n-butyl lithium in a solvent such as toluene or THF at a temperature of −100° C. to 50° C., and then the resulting product is reacted with phenanthrolines or benzo[h]quinolines at a temperature of −20° C. to 60° C. and a reactant is treated by a normal method, and then the obtained compound is treated with manganese dioxide, nitrobenzene, chloranil, DDQ, air, oxygen, or water.

Examples of a method of introducing B include a method of reacting a compound in which B is hydrogen in the general formula (1) with alkyllithium or aryllithium which is a lithiated substance of an alkyl group or an aryl group introduced at this stage, or alkylmagnesium halide or arylmagnesium halide, Grignard reagents, in a solvent such as toluene or THF at a temperature of −20° C. to 60° C., treating a reactant by a normal method, and then treating the obtained compound with manganese dioxide, nitrobenzene, chloranil, DDQ, air, oxygen, or water. The above-mentioned alkyllithium and aryllithium can be obtained by reacting the corresponding alkyl halide and aryl halide with alkyllithium such as metal lithium or n-butyl lithium. Alkylmagnesium halide and arylmagnesium halide can be obtained by reacting the corresponding alkyl halide and aryl halide with metal magnesium.

The material for a light emitting device of the general formula (1) can be purified by a purification method alone such as column chromatography, recrystallization or sublimation or a combination thereof. In the column chromatography, the material for a light emitting device can be purified using silica gel, alumina, Florisil or the like as a packing material. In the recrystallization, the material for a light emitting device can be purified using one of or a mixture of solvents usually used such as toluene, hexane, tetrahydrofuran, dioxane, dimethoxyethane, ethanol, methanol, acetone, methyl ethyl ketone, ethyl acetate, n-butyrolactone, nitrobenzene, dichloromethane, chloroform, dimethyl sulfoxide, dimethylformamide, 1-methyl-2-pyrrolidone, 1,3-dimethyl-2-imidazolidinone, pyridine and triethylamine.

Further, the present invention pertains to a light emitting device containing the material for a light emitting device expressed by the above-mentioned general formula (1).

The light emitting device of the present invention is composed of at least an anode and a cathode, and an organic layer interposed between the anode and the cathode.

Further, in order to maintain the mechanical strength of the light emitting device, the light emitting device is preferably formed on a substrate. As the substrate, a substrate of glass such as soda glass and alkali-free glass is suitably used. As a thickness of the glass substrate, a thickness of 0.5 mm or more is enough since the glass substrate can be suitably used if it has an adequate thickness for maintaining the mechanical strength. As for the material of glass, alkali-free glass is more preferred since fewer ions eluted from glass is better, but soda lime glass coated with a barrier coat such as $SiO_2$ is commercially available and it can also be used. Further, the substrate does not have to be glass as long as an anode of the substrate operates stably, and for example the anode may be formed on a plastic substrate.

A material to be used in an anode is not particularly limited as long as it is a material in which a hole can be efficiently injected into an organic layer, but a material having a relatively large work function is preferably used. Examples of the anode material include conductive metal oxides such as tin oxide, indium oxide and indium-tin oxide (ITO), metals such as gold, silver and chromium, inorganic conductive substances such as copper iodide and copper sulfide, and conductive polymers such as polythiophene, polypyrrole and polyaniline. These electrode materials may be used alone or may be used by forming a multi-layer of or mixing a plurality of materials.

Resistance of the electrode may be one which can supply a sufficient current for the emission of a light emitting device, but it is desirably low resistance from the viewpoint of the power consumption of the light emitting device. For example, an ITO substrate having resistance of 300Ω/□ or lower functions as a device electrode, but it is particularly desirable to use a low resistance article of 100Ω/□ or lower since currently, it becomes possible to supply a substrate of about 10Ω/□. A thickness of the ITO can be arbitrarily selected in accordance with the value of resistance, but the ITOs of 100 to 300 nm in thickness are usually often used. A method of forming an ITO film is not particularly limited and examples of the methods include an electron beam method, a sputtering method and a chemical reaction method.

A material to be used in a cathode is not particularly limited as long as it is a material in which an electron can be efficiently injected into an organic layer, and examples of the material generally include platinum, gold, silver, copper, iron, tin, zinc, aluminum, indium, chromium, lithium, sodium, potassium, cesium, calcium and magnesium. In order to enhance the electron injection efficiency to improve device characteristics, lithium, sodium, potassium, cesium, calcium and magnesium, or alloys containing these metals of a low work function are preferred. A preferred example of the cathode includes a method of using a highly stable electrode by doping the organic layer with a trace of lithium, cesium or magnesium (a film thickness by vacuum deposition is 1 nm or less in terms of a readout by a film thickness meter) because generally, these metals of a low work function are often unstable in the air. But, the preferred example is not particularly limited to this because inorganic salts such as lithium fluoride, cesium fluoride, lithium oxide and cesium oxide can be used. Further, it is a preferred example to form a multi-layer of metals such as platinum, gold, silver, copper, iron, tin, aluminum and indium, or alloys using these metals, and inorganic substances such as silica, titania and silicon nitride, and polyvinyl alcohol, vinyl chloride or hydrocarbon high polymer compounds in order to protect an electrode.

A method of preparing these electrodes is not particularly limited as long as it is a method capable of conducting with a resistance heating method, an electron beam method, a sputtering method, an ion plating method, a coating method or the like.

The organic layer composing the light emitting device of the present invention is composed of one kind or two or more kinds of materials for a light emitting device. Herein, the term material for a light emitting device refers to any one compound of a substance emitting light by itself and a substance assisting this self-emitting substance to emit light, namely, a compound involved in the emission. Specifically, a hole transporting material, an emissive material and an electron transporting material correspond to this compound, and the material for a light emitting device of the present invention is also included in this. The material for a light emitting device of the present invention can also be used as an emissive material in these materials, but it is suitably used as an electron transporting material because of high electron transporting ability.

Examples of the constitution of the organic layer include multi-layer constitutions such as 1) a hole transporting layer/an emissive layer/an electron transporting layer and 2) an emissive layer/an electron transporting layer in addition to a constitution consisting of only an emissive layer. Further, the above-mentioned respective layers may be composed of a single layer or may be composed of a plurality of layers. When the hole transporting layer and the electron transporting layer are composed of a plurality of layers, the layers on the side meeting an electrode may be referred to as a hole injection layer and an electron injection layer, respectively, but the hole injection layer is included in the hole transporting layer and the electron injection layer is included in the electron transporting layer in the following description.

A hole transporting layer is formed by forming a multi-layer of or mixing one kind or two or more kinds of hole transporting materials, or is formed from a mixture of the hole transporting material and a high polymer binder. Further, the hole transporting layer may be formed by adding inorganic salt such as ferric chloride to the hole transporting material. Preferred examples of the hole transporting materials include triphenylamine derivatives such as 4,4'-bis(N-(3-methylphenyl)-N-phenylamino)biphenyl, 4,4'-bis(N-(1-naphthyl)-N-phenylamino)biphenyl and 4,4',4",-tris(3-methylphenyl(phenyl)amino)triphenylamine, heterocyclic compounds such as biscarbazole derivatives like bis(N-allylcarbazole) and bis(N-alkylcarbazole), indole derivatives, pyrazoline derivatives, stilbene compounds, hydrazone compounds, benzofuran derivatives, thiophene derivatives, oxadiazole derivatives, phthalocyanine derivatives and porphyrin derivatives, and polymers such as polycarbonate and styrene derivatives, having the foregoing monomers on the side chains, polyvinylcarbazole and polysilane. The hole transporting material is not particularly limited as long as it is a compound in which a thin film required for preparing a light emitting device can be formed, a hole can be injected from an anode and a hole can be transported.

In the present invention, the emissive layer may be composed of a single layer or a plurality of layers, and each layer is formed from an emissive material and the emissive material may be a mixture of a host material and a dopant material or a host material alone. That is, in the light emitting device of the present invention, only the host material or the dopant material may emit light, or the host material and the dopant material may emit light together in each layer. The host material and the dopant material may consist of one kind or a plurality of kinds. The dopant material may be included in the whole host material or may be partially included in the host material. The dopant material may be multilayered or dispersed. Since the phenomenon of concentration quenching takes place when an amount of the dopant material to be used is too large, this amount is preferably 20% by weight or less with respect to the host material, and more preferably 10% by weight or less. As a method of doping the layer with the dopant material, a method of co-evaporation of the dopant material with the host material can be used, but a method of depositing a mixture of the dopant material and the host material previously prepared may also be used.

Further, the emissive material of the present invention may be fluorescent or phosphorescent. In addition, the fluorescent emission in the present invention refers to the emission based on the transition between the states having the same spin multiplicities and the phosphorescent emission refers to the emission based on the transition between the states having the different spin multiplicities. For example, the emission associated with the transition from a state of singlet excitation to a ground state (generally, a ground state of an organic compound is singlet) is fluorescent emission and the emission associated with the transition from a state of triplet excitation to a ground state is phosphorescent emission.

A dopant material used in the present invention is not particularly limited and a known compound can be used as a dopant material and the dopant material can be selected from various materials in accordance with a desired emission color.

Specifically, examples of blue to blue-green dopant materials include, but not limited to, aromatic hydrocarbon compounds such as naphthalene, anthracene, phenanthrene, pyrene, triphenylene, perylene, fluorene and indene and derivatives thereof, and aromatic heterocyclic compounds such as furan, pyrrole, thiophene, sylol, 9-silafluorene, 9,9'-spirobisilafluorene, benzothiophene, benzofuran, indole, dibenzothiophene, dibenzofuran, imidazopyridine, phenanthroline, pyrazine, naphthylidine, quinoxaline, pyrrolopyridine, thioxanthen, imidazopyridine and derivatives thereof, distyrylbenzene derivatives, tetraphenylbutadiene derivatives, stilbene derivatives, aldazine derivatives, coumarin derivatives, azole derivatives such as imidazole, thiazole, thiadiazole, carbazol, oxazole, oxadiazole and triazole and metal complexes thereof, and aromatic amine derivatives typified by N,N'-diphenyl-N,N'-di(3-methylphenyl)-4,4'-diphenyl-1,1'-diamine.

Further, examples of green to yellow dopant materials include coumarin derivatives, phthalimide derivatives, naphthalimide derivatives, perynone derivatives, pyrrolopyrrole derivatives, cyclopentadiene derivatives, acridone derivatives, quinacridone derivatives, pyrrolopyrrole derivatives, pyrromethene derivatives, and naphthacene derivatives such as rubrene, and further suitable examples of the green to yellow dopant materials also include compounds formed by introducing a substituent capable of lengthening a wavelength of an emission color such as an aryl group, a heteroaryl group, an arylvinyl group, an amino group and a cyano group into the compounds exemplified as the above-mentioned blue to blue-green dopant materials.

Further, examples of orange to red dopant materials include naphthalimide derivatives such as bis(diisopropylphenyl)perylenetetracarboxylic imide, perynone derivatives, rare-earth complexes such as an Eu complex having acetylacetone or benzoylacetone and phenanthroline as a ligand, 4-(dicyanomethylene)-2-methyl-6-(p-dimethylaminostyryl)-4H-pyran and analogues thereof, metal phthalocyanine derivatives such as magnesium phthalocyanine and aluminum chlorophthalocyanine, rhodamine compounds, deazaflavin derivatives, coumarin derivatives, quinacridone derivatives, phenoxazine derivatives, oxazine derivatives, quinazoline derivatives, pyrromethene derivatives, pyrrolopyridine derivatives, squarylium derivatives, violanthrone derivatives, phenazine derivatives, phenoxazone derivatives and thiadiazolopyrene derivatives. Further, suitable examples of orange to red dopant materials also include compounds formed by introducing a substituent capable of lengthening a wavelength of an emission color such as an aryl group, a heteroaryl group, an arylvinyl group, an amino group and a cyano group into the compounds exemplified as the above-mentioned blue to blue-green dopant materials and the above-mentioned green to yellow dopant materials. Further, suitable examples of orange to red dopant materials also include phosphorescent metal complexes containing iridium or platinum as a central metal typified by tris(2-phenylpyridine)iridium (III).

As a host material used in the present invention, but not particularly limited, condensed ring derivatives such as anthracene and pyrene which have been hitherto known as a emissive body, metal-chelated oxinoid compounds including tris(8-quinolinolato)aluminum (III), bisstyryl derivatives such as bisstyrylanthracene derivatives and distyrylbenzene derivatives, tetraphenylbutadiene derivatives, coumarin derivatives, oxadiazole derivatives, pyrrolopyridine derivatives, perynone derivatives, cyclopentadiene derivatives, oxadiazole derivatives, thiadiazolopyridine derivatives, pyrrolopyrrole derivatives, and polymers such as poly(phenylenevinylene) derivatives, poly(p-phenylene) derivatives and polythiophene derivatives are suitably used.

Further, a host material of an emissive layer exhibiting phosphorescence emission is not particularly limited, and examples of the host materials include carbazole derivatives such as 4,4'-bis(carbazolyl-N-yl)biphenyl and N,N'-diphenyl-3,3'-biscarbazole, triphenylamine derivatives such as N,N'-diphenyl-N,N'-di(3-methylphenyl)-4,4'-diphenyl-1,1'-diamine and N,N'-dinaphthyl-N,N'-diphenyl-4,4'-diphenyl- 1,1'-diamine, indole derivatives, azole derivatives such as triazole, oxadiazole and imidazole, phenanthroline derivatives, quinoline derivatives, quinoxaline derivatives, naphthylidine derivatives, and oligopyridine derivatives such as bipyridine and terpyridine.

In the present invention, an electron transporting layer is a layer responsible for injecting an electron from a cathode and further transporting the electron and it desirably has high electron injection efficiency and transports the injected electron efficiently. For this, the material of the electron transporting layer is required to be a substance which has large electron affinity and large electron mobility and further has excellent stability and hardly produces impurities to be a trap at the time of production and use. However, if considering the transporting balance between hole transporting and electron transporting, there is the case where the electron transporting layer mainly plays a role in preventing efficiently a hole from an anode from passing to a cathode without recombining. In this case, even if the electron transporting ability of the electron transporting layer is not so high, the electron transporting layer has the same effect of improving the emission efficiency as that of a material having high electron transporting ability. In this case, the electron transporting layer acts as a hole blocking layer capable of blocking the travel of hole efficiently.

The electron transporting layer of the present invention is formed by forming a multi-layer of or mixing one kind or two or more kinds of electron transporting materials, or is formed from a mixture of the electron transporting material and a high polymer binder. Further, the electron transporting layer may be formed by mixing metal such as lithium or cesium, or inorganic salt such as lithium fluoride or cesium fluoride in the electron transporting material.

As the electron transporting material, the material for a light emitting device of the present invention is more preferred, but metal complexes of quinolinol derivatives including (8-hydroxyquinoline)aluminum, tropolone metal complexes, flavonol metal complexes, perylene derivatives, perynone derivatives, naphthalene derivatives, coumarin derivatives, pyridine derivatives, quinoline derivatives, quinoxaline derivatives, benzoquinoline derivatives, phenanthroline derivatives, thiophene derivatives, oxazole derivatives, thiazole derivatives, oxadiazole derivatives, triazole derivatives, benzothiazole derivatives, benzoxazole derivatives, benzimidazole derivatives, diphenylphosphine oxide derivatives, silole derivatives, triphenylsilane derivatives, aldazine derivatives, bisstyryl derivatives, and pyrazine derivatives can also be used.

The materials used in the above-mentioned hole transporting layer, emissive layer and electron transporting layer can form the respective layers singly or by forming a multi-layer of or mixing two or more kinds of substances, but they can also be dispersed in solvent-soluble resins such as polyvinyl chloride, polycarbonate, polystyrene, poly(N-vinylcarbazole), poly(methyl methacrylate), poly(butyl methacrylate), polyester, polysulfone, polyphenylene oxide, polybutadiene, hydrocarbon resin, ketone resin, phenoxy resin, polysulphone, polyamide, ethylcellulose, vinyl acetate, ABS resin and polyurethane resin, or curable resins such as phenol resin, xylene resin, petroleum resin, urea resin, melamine resin, unsaturated polyester resin, alkyd resin, epoxy resin and silicone resin as a high polymer binder to be used. The above-mentioned high polymer binder is used for forming a thermally stable thin film, and in doing so, a coating method or an ink-jet method is preferably employed.

A method of forming the organic layer in the light emitting device of the present invention is not particularly limited and examples of the methods include a resistance heating evaporation method, an electron beam deposition method, a sputtering method, a molecular stacking method and a coating method. Usually, the resistance heating evaporation method and the electron beam deposition method are preferred in terms of characteristics. A thickness of the organic layer cannot be limited since it depends on the resistance of the organic layer, but it is preferably 1 to 1000 nm.

In the present invention, electrical energy mainly refers to a direct current but a pulse current or an alternating current can be used. The values of a current and a voltage is not particularly limited but the light emitting device should be adapted in such a way that the maximum emission brightness is achieved with as low energy as possible in consideration of the power consumption and the life of the device.

The light emitting device of the present invention is suitably used as a matrix type light emitting device. Herein, the term matrix type refers to a light emitting device in which pixels for display are arrayed in a matrix and a set of the pixels display characters and images. The shape and size of the pixel is determined by the uses. For example, for displaying images and characters of a personal computer, a monitor and a TV set, square pixels having a side of 300 μm or smaller are generally used, and in the case of a large display such as a display panel, pixels having a side of the order of millimeter are used. In the case of monochrome display, pixels having the same color may be arrayed, but in the case of color display, a red, a green and a blue pixels are arrayed and display. In this case, there are typically a delta type and a stripe type. Further, as for a method of driving this matrix, any one of a passive matrix driving method and an active matrix method may be used. The passive matrix driving has an advantage that its structure is simpler. When considering the operational characteristics, since there may be cases where the active matrix is superior to the passive matrix driving, the driving method to be used is preferably changed in accordance with applications.

The light emitting device of the present invention is also suitably used as a segment type light emitting device. Herein, the term segment type refers to a light emitting device in which a pattern is formed so as to display predetermined information and a prescribed area emits light. Examples of this type include time indications and temperature indications in a digital clock and a thermometer, display of operational state of audio equipment or an electromagnetic cookware and an automobile panel display. Further, the foregoing matrix display and the foregoing segment display may co-exist in the same panel.

The light emitting device of the present invention is also suitably used as a backlight. Herein, the term backlight refers to a light emitting device which is used for the purpose of improving the visibility of a display principally not performing spontaneous emission and used for a liquid crystal display, a clock, audio equipment, an automobile panel display, a display board, and a sign. The backlight in the present invention is characterized by a low-profile and light weight particularly as a backlight for liquid crystal displays, among others, a backlight for personal computers in which a low-profile is an important issue, considering that it is difficult to make the conventional type backlights a low-profile since they are constructed from a fluorescent lamp or a light guiding plate.

EXAMPLES

Hereinafter, the present invention will be described by way of examples and comparative examples, but the present invention is not limited to these examples.

Example 1

Synthesis of E-20

101 g of 8-amino-7-quinoline carboaldehyde was reacted with 45 g of 1,3-diacetylbenzene and 100 g of 85% potassium hydroxide in 1800 ml of ethanol for 10 hours while refluxing and a reactant was treated by a normal method to obtain 100 g of 1,3-di(1,10-phenanthroline-2-yl)benzene. 40.8 g of this 1,3-di(1,10-phenanthroline-2-yl)benzene was reacted with 400 ml of phenyl lithium (0.94 M cyclohexane-ether solution) in 750 ml of toluene for 2.5 hours while cooling with ice and a reactant was treated by a normal method. The obtained product was reacted with 118 g of nitrobenzene at 110° C. for 3 hours and a reactant was treated by a normal method to obtain 22.8 g of E-20.

The obtained compound was dissolved in $CDCl_3$ and measured by $^1$H-NMR to observe the following peaks.

$^1$H-NMR (ppm): 9.75 (s, 1H), 8.72 (d•d, 2H), 8.57-8.17 (m, 12H), 7.90-7.82 (m, 5H), 7.61-7.48 (m, 6H).

Further, this E-20 was purified by sublimation at about 320° C. at a pressure of $1.0 \times 10^{-3}$ Pa using an oil diffusion pump and then used for a light emitting device. The purity of the E-20 purified by sublimation was measured with a HPLC (C8 column, eluate: 0.1% aqueous solution of phosphoric acid/acetonitrile). Consequently, the purity (area percentage at a measuring wavelength of 254 nm) of HPLC was 99.9%. In the following examples, the purity of HPLC was measured by the same method.

Example 2

Synthesis of E-9

11.9 g of 1-bromonaphthalene was reacted with 1.6 g of lithium in 58 ml of diethyl ether at room temperature for 3 hours and the produced dense violet solution was added dropwise to 100 ml of a toluene suspension of 5.0 g of 1,4-di(1,10-phenanthroline-2-yl)benzene at room temperature. The resulting mixture was reacted at room temperature for three days and then treated by a normal method. The obtained product was reacted with 100 g of manganese dioxide in 400 ml of dichloromethane at room temperature for 3 hours and a reactant was treated by a normal method to obtain 1.14 g of E-9.

$^1$H-NMR ($CDCl_3$, ppm): 8.55-7.16 (m, 30H)

Further, this E-9 was purified by sublimation and then used for a light emitting device as with Example 1. The purity (area percentage at a measuring wavelength of 254 nm) of HPLC of the E-9 purified by sublimation was 99.8%.

Example 3

Synthesis of E-57

54.0 g of 2,7-dihydroxynaphthalene was dissolved in a mixture of 680 ml of dichloromethane and 136 ml of pyridine, and to this, 228 g of trifluoromethanesulfonic anhydride (produced by TOKYO CHEMICAL INDUSTRY CO., LTD.) was added dropwise at 0° C. After the resulting mixture was reacted at 5° C. for 2 hours and then at room temperature for one day, a reactant was treated by a normal method to obtain 143 g of 2,7-bis(trifluoromethane sulfonyloxy)naphthalene. 143 g of this 2,7-bis(trifluoromethane sulfonyloxy)naphthalene was mixed with 216 ml of n-butyl vinyl ether, 113 ml of triethylamine, 2.78 g of 1,3-bis(diphenylphosphino)propane, 0.76 g of palladium acetate and 680 ml of dimethylformamide and the resulting mixture was reacted at 70 to 85° C. for two days. The reactant was treated by a normal method to obtain 40 g of 2,7-diacetylnaphthalene. 4.62 g of this 2,7-diacetylnaphthalene was reacted with 7.87 g of 8-amino-7-quinoline carboaldehyde and 7.9 g of potassium hydroxide in 220 ml of ethanol at 60° C. and a reactant was treated by a normal method to obtain 4.44 g of 2,7-di(1,10-phenanthroline-2-yl) naphthalene. 5.48 g of this 2,7-di(1,10-phenanthroline-2-yl) naphthalene was reacted with 22.6 ml of phenyl lithium (2.0 M cyclohexane-ether solution) in 200 ml of toluene at room temperature for 2 days and a reactant was treated by a normal method. The obtained product was reacted with 100 g of manganese dioxide in 400 ml of dichloromethane at room temperature for 2.5 hours and a reactant was treated by a normal method to obtain 0.93 g of E-57.

$^1$H-NMR ($CDCl_3$, ppm): 8.96 (s, 2H), 8.86 (d•d, 2H), 8.61-8.51 (m, 4H), 8.42-8.34 (m, 6H), 8.18 (d•d, 4H), 7.84 (m, 4H), 7.65-7.48 (m, 6H).

Further, this E-57 was purified by sublimation and then used for a light emitting device as with Example 1. The purity (area percentage at a measuring wavelength of 254 nm) of HPLC of the E-57 purified by sublimation was 99.8%.

Example 4

Synthesis of E-25

5.88 g of 1-bromo-4-t-butylbenzen was reacted with 0.76 g of lithium in 50 ml of diethyl ether for 5 hours while refluxing and the produced gray solution was added dropwise to 150 ml of a toluene suspension of 4.0 g of 1,3-di(1,10-phenanthroline-2-yl)benzene while cooling with ice. The resulting mixture was reacted for 1 hour while cooling with ice and then treated by a normal method. The obtained product was reacted with 66 g of manganese dioxide in 150 ml of dichloromethane at room temperature for 30 minutes and a reactant was treated by a normal method to obtain 3.65 g of E-25.

$^1$H-NMR ($CDCl_3$, ppm): 9.81 (s, 1H), 8.71 (d•d, 2H), 8.51-8.38 (m, 8H), 8.31 (d, 2H), 8.14 (d, 2H), 7.88-7.81 (m, 5H), 7.58 (d, 4H), 1.43 (s, 18H).

Further, this E-25 was purified by sublimation and then used for a light emitting device as with Example 1. The purity (area percentage at a measuring wavelength of 254 nm) of HPLC of the E-25 purified by sublimation was 99.9%.

Example 5

Synthesis of E-23

6.18 g of 5-bromo-m-xylene was reacted with 0.92 g of lithium in 50 ml of diethyl ether for 5 hours while refluxing and the produced gray solution was added dropwise to 100 ml of a toluene suspension of 3.63 g of 1,3-di(1,10-phenanthroline-2-yl)benzene while cooling with ice. The resulting mixture was reacted at room temperature for 2 hours and then treated by a normal method. The obtained product was reacted with 63 g of manganese dioxide in 200 ml of dichloromethane at room temperature for 2 hours and a reactant was treated by a normal method to obtain 1.4 g of E-23.

$^1$H-NMR ($CDCl_3$, ppm): 9.53 (s, 1H), 8.72 (d•d, 2H), 8.46-8.14 (m, 12H), 7.85-7.79 (m, 5H), 7.13 (s, 2H), 2.47 (s, 12H).

Further, this E-23 was purified by sublimation and then used for a light emitting device as with Example 1. The purity (area percentage at a measuring wavelength of 254 nm) of HPLC of the E-23 purified by sublimation was 99.8%.

Example 6

Synthesis of E-21

6.84 g of 4-bromotoluene was reacted with 1.1 g of lithium in 60 ml of diethyl ether for 5 hours while refluxing and the produced gray solution was added dropwise to 100 ml of a toluene suspension of 4.34 g of 1,3-di(1,10-phenanthroline-2-yl)benzene while cooling with ice. The resulting mixture was reacted for 2 hours while cooling with ice and then treated by a normal method. The obtained product was reacted with 75 g of manganese dioxide in 200 ml of dichloromethane at room temperature for 2 hours and a reactant was treated by a normal method to obtain 2.1 g of E-21.

$^1$H-NMR (CDCl$_3$, ppm): 9.72 (s, 1H), 8.72 (d•d, 2H), 8.53-7.36 (m, 19H), 2.48 (s, 6H).

Further, this E-21 was purified by sublimation and then used for a light emitting device as with Example 1. The purity (area percentage at a measuring wavelength of 254 nm) of HPLC of the E-21 purified by sublimation was 99.8%.

Example 7

Synthesis of E-33

3.57 g of 1-bromonaphthalene was reacted with 0.48 g of lithium in 50 ml of diethyl ether at room temperature for 3 hours and the produced dense violet solution was added dropwise to 100 ml of a toluene suspension of 2.5 g of 1,3-di(1,10-phenanthroline-2-yl)benzene while cooling with ice. The resulting mixture was reacted at room temperature for two hours and then treated by a normal method. The obtained product was reacted with 50 g of manganese dioxide in 500 ml of dichloromethane at room temperature for 15 minutes and a reactant was treated by a normal method to obtain 0.4 g of E-33.

$^1$H-NMR (CDCl$_3$, ppm): 9.43 (s, 1H), 9.02 (d, 2H), 8.53 (d, 2H), 8.40 (d, 2H), 8.29-7.43 (m, 23H).

Further, this E-33 was purified by sublimation and then used for a light emitting device as with Example 1. The purity (area percentage at a measuring wavelength of 254 nm) of HPLC of the E-33 purified by sublimation was 99.8%.

Example 8

Synthesis of E-4

2.5 g of 1,4-di(1,10-phenanthroline-2-yl)benzene was reacted with 11.5 ml of phenyl lithium (2.0 M cyclohexane-ether solution) in 100 ml of toluene for 1 hour while cooling with ice and then at room temperature for 4 hours and a reactant was treated by a normal method. The obtained product was reacted with 50 g of manganese dioxide in 400 ml of dichloromethane at room temperature for 5 minutes and a reactant was treated by a normal method to obtain 0.80 g of E-4.

$^1$H-NMR (CDCl$_3$, ppm): 8.75 (s, 4H), 8.53 (d, 4H), 8.39-8.18 (m, 8H), 7.84 (s, 4H), 7.65-7.50 (m, 6H).

Further, this E-4 was purified by sublimation and then used for a light emitting device as with Example 1. The purity (area percentage at a measuring wavelength of 254 nm) of HPLC of the E-4 purified by sublimation was 99.9%.

Example 9

Synthesis of E-8

3.68 g of 1-bromo-4-t-butylbenzen was reacted with 0.48 g of lithium in 50 ml of diethyl ether for 5 hours while refluxing and the produced gray solution was added dropwise to 150 ml of a toluene suspension of 2.5 g of 1,4-di(1,10-phenanthroline-2-yl)benzene while cooling with ice. The resulting mixture was reacted for 3 hours while cooling with ice and then treated by a normal method to obtain 1.66 g of E-8.

$^1$H-NMR (CDCl$_3$, ppm): 8.73 (s, 4H), 8.45-8.15 (m, 12H), 7.82 (s, 4H), 7.62-7.12 (m, 4H), 1.40 (s, 18H).

Further, this E-8 was purified by sublimation and then used for a light emitting device as with Example 1. The purity (area percentage at a measuring wavelength of 254 nm) of HPLC of the E-8 purified by sublimation was 99.9%.

Example 10

Synthesis of E-17

5.0 g of 1,3-di(1,10-phenanthroline-2-yl)benzene was reacted with 17.3 ml of methyl lithium (2.2 M ether solution) in 120 ml of toluene for 5 hours while cooling with ice and a reactant was treated by a normal method. The obtained product was reacted with 70 g of manganese dioxide in 500 ml of dichloromethane at room temperature for 2 hours and a reactant was treated by a normal method to obtain 4.25 g of E-17.

$^1$H-NMR (CDCl$_3$, ppm): 9.28 (s, 1H), 8.64 (d•d, 2H), 8.38 (d, 4H), 8.17 (d, 2H), 7.82-7.75 (m, 5H), 7.54 (d, 2H), 3.01 (s, 6H).

Further, this E-17 was purified by sublimation and then used for a light emitting device as with Example 1. The purity (area percentage at a measuring wavelength of 254 nm) of HPLC of the E-17 purified by sublimation was 99.8%.

Example 11

An ITO substrate, in which an ITO film of 130 nm in thickness was formed as an anode on the surface of an alkali-free glass plate of 1.1 mm in thickness by a sputtering deposition method, was prepared. After this ITO film was patterned by a photolithographic process, it was cut into pieces having a size of 46 mm×38 mm and a substrate having an ITO film of 12 mm in width at the center of the substrate was prepared.

This substrate was cleaned with "SEMICOCLEAN 56" (produced by Furuchi Chemical Corporation) and placed in a vacuum deposition apparatus after treating with UV ozone, and the apparatus was evacuated until its vacuum reached $5×10^{-5}$ Pa. In a state of locating a shadow mask for an organic layer having an opening 15 mm square, by a resistance heating method, copper phthalocyanine was first vapor-deposited in a thickness of 20 nm as a hole injection material, and 4,4'-bis(N-(1-naphthyl)-N-phenylamino)biphenyl was vapor-deposited in a thickness of 100 nm as a hole transporting material. Next, tris(quinolinol)aluminum complex (Alq3) was vapor-deposited in a thickness of 50 nm as an emissive material. Next, the above-mentioned E-20 was vapor-deposited in a thickness of 100 nm as an electron transporting material. Next, the organic layer was doped with lithium of 0.5 nm. Then, the shadow mask for an organic layer was exchanged to a shadow mask for a cathode having four openings of 5×12 mm and aluminum was vapor-deposited in a thickness of 200 nm to prepare a cathode. The thickness referred to herein means a readout by a quartz oscillating film thickness monitor. A light emitting device having four emissive regions of 5×5 mm was thus prepared on the substrate. When a direct current of 1 mA was passed through this light emitting device, green emission with emission brightness of 200 candelas/square meter was attained. Incidentally, the emission brightness was measured in the conditions of viewing angle of 0.2 degrees and a response time of 1 ms using a luminance meter (manufactured by TOPCON CORPORATION, BM-8). The driving voltage at this time was 5.5 V. This light emitting device had very excellent durability and retained 85% of the emission brightness in 1000 hours in the condition of driving at a constant-current of 1 mA.

Further, when this light emitting device was pulse-driven at a current of 1 mA (duty ratio 1:60, current of pulse duration 60 mA) in a vacuum cell, good emission was observed.

Further, a residue after vapor-depositing E-20 was recovered and the purity of HPLC of the E-20 was measured. Consequently, the purity (area percentage at a measuring wavelength of 254 nm) of HPLC was 99.9%, and the purity of E-20 was not reduced compared with that of E-20 before vapor deposition. From this, it was evident that E-20 has a good sublimation property and it does not cause denaturation such as degradation or polymerization at the time of vapor deposition.

Examples 12 to 20

Light emitting devices were prepared by following the same procedure as in Example 11 except for using materials shown in Table 1 as an electron transporting material. The results of evaluations of the obtained light emitting devices and the purities of HPLC of the residues after vapor deposition were shown in Table 1.

TABLE 1

| | Electron transporting material | Emission color | Emission brightness (cd/m$^2$) | Driving voltage (V) | Retention of emission brightness after a lapse of 1000 hours (%) | Purity of HPLC of residue after vapor deposition (%) |
|---|---|---|---|---|---|---|
| Example 11 | E-20 | Green | 200 | 5.5 | 85 | 99.9 |
| Example 12 | E-9 | Green | 195 | 5.4 | 78 | 99.8 |
| Example 13 | E-57 | Green | 195 | 5.6 | 80 | 99.8 |
| Example 14 | E-25 | Green | 203 | 5.5 | 85 | 99.9 |
| Example 15 | E-23 | Green | 198 | 5.6 | 85 | 99.8 |
| Example 16 | E-21 | Green | 197 | 5.5 | 85 | 99.8 |
| Example 17 | E-33 | Green | 202 | 5.4 | 85 | 99.8 |
| Example 18 | E-4 | Green | 205 | 5.4 | 86 | 99.9 |
| Example 19 | E-8 | Green | 206 | 5.4 | 87 | 99.9 |
| Example 20 | E-17 | Green | 208 | 5.6 | 80 | 99.8 |

Comparative Example 1

A light emitting device was prepared by following the same procedure as in Example 11 except for using P-1 shown by the following formula as an electron transporting material. When a direct current of 1 mA was passed through this light emitting device, green emission with emission brightness of 200 candelas/square meter was attained. The driving voltage at this time was 7.0 V. The emission brightness of this light emitting device decreased by half in 900 hours in the condition of driving at a constant-current of 1 mA.

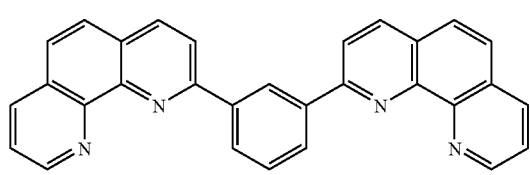

P-1

Comparative Example 2

A light emitting device was prepared by following the same procedure as in Example 11 except for using P-2 shown by the following formula as an electron transporting material. When a direct current of 1 mA was passed through this light emitting device, green emission with emission brightness of 190 candelas/square meter was attained. The driving voltage at this time was 6.8 V. The emission brightness of this light emitting device decreased by half in 1000 hours in the condition of driving at a constant-current of 1 mA.

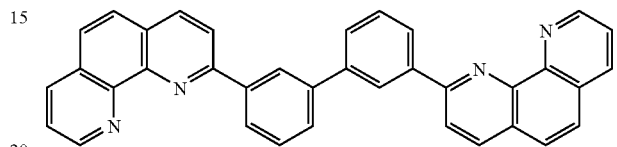

P-2

Comparative Example 3

A light emitting device was prepared by following the same procedure as in Example 11 except for using P-3 shown by the following formula as an electron transporting material.

When a direct current of 1 mA was passed through this light emitting device, green emission with emission brightness of 195 candelas/square meter was attained. The driving voltage at this time was 7.1 V. The emission brightness of this light emitting device decreased by half in 500 hours in the condition of driving at a constant-current of 1 mA.

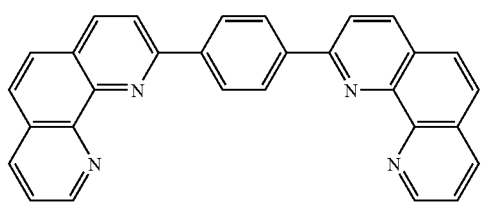

P-3

Comparative Example 4

A light emitting device was prepared by following the same procedure as in Example 11 except for using P-4 shown by the following formula as an electron transporting material. When a direct current of 1 mA was passed through this light emitting device, green emission with emission brightness of 200 candelas/square meter was attained. The driving voltage at this time was 7.2 V. The emission brightness of this light emitting device decreased by half in 450 hours in the condition of driving at a constant-current of 1 mA.

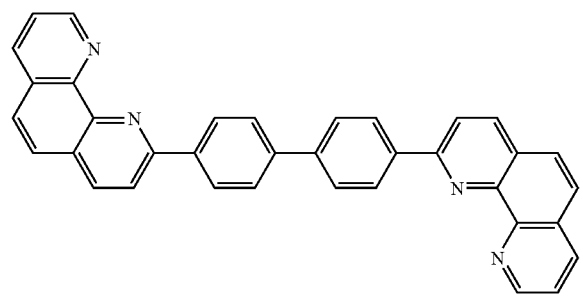

Comparative Example 5

A light emitting device was prepared by following the same procedure as in Example 11 except for using P-5 shown by the following formula as an electron transporting material. When a direct current of 1 mA was passed through this light emitting device, green emission with emission brightness of 180 candelas/square meter was attained. The driving voltage at this time was 7.0 V. The emission brightness of this light emitting device decreased by half in 300 hours in the condition of driving at a constant-current of 1 mA.

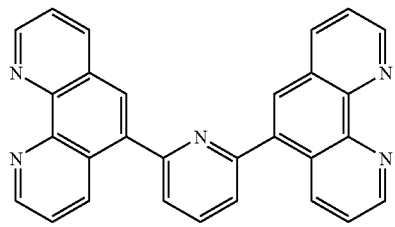

Comparative Example 6

A light emitting device was prepared by following the same procedure as in Example 11 except for using P-6 shown by the following formula as an electron transporting material. When a direct current of 1 mA was passed through this light emitting device, green emission with emission brightness of 190 candelas/square meter was attained. The driving voltage at this time was 6.8 V. The emission brightness of this light emitting device decreased by half in 700 hours in the condition of driving at a constant-current of 1 mA.

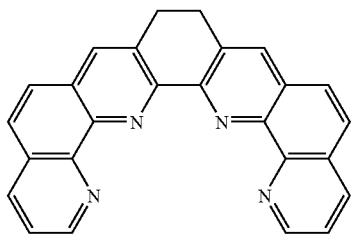

Comparative Example 7

A light emitting device was prepared by following the same procedure as in Example 11 except for using P-7 shown by the following formula as an electron transporting material. When a direct current of 1 mA was passed through this light emitting device, green emission with emission brightness of 195 candelas/square meter was attained. The driving voltage at this time was 5.6 V. This light emitting device retained 80% of the emission brightness in 1000 hours in the condition of driving at a constant-current of 1 mA.

A residue after vapor-depositing this P-7 was recovered and the purity of HPLC of the P-7 was measured. Consequently, the purity (area percentage at a measuring wavelength of 254 nm) of HPLC was 98%, and the purity of P-7 was reduced compared with that (99.9%) of P-7 before vapor deposition. From this, it was evident that P-7 was decomposed at the time of vapor deposition.

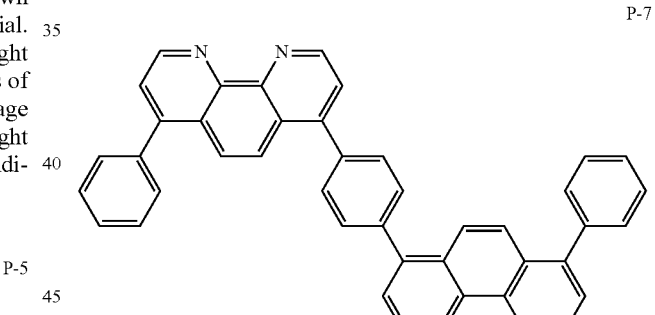

Comparative Example 8

A light emitting device was prepared by following the same procedure as in Example 11 except for using P-8 shown by the following formula as an electron transporting material. When a direct current of 1 mA was passed through this light emitting device, green emission with emission brightness of 200 candelas/square meter was attained. The driving voltage at this time was 5.5 V. This light emitting device retained 80% of the emission brightness in 1000 hours in the condition of driving at a constant-current of 1 mA.

A residue after vapor-depositing this P-8 was recovered and the purity of HPLC of the P-8 was measured. Consequently, the purity (area percentage at a measuring wavelength of 254 nm) of HPLC was 98.2%, and the purity of P-8 was reduced compared with that (99.8%) of P-8 before vapor deposition. From this, it was evident that P-8 was decomposed at the time of vapor deposition.

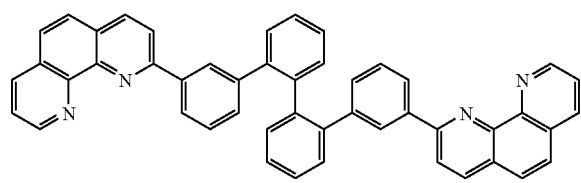

P-8

Example 21

A light emitting device was prepared by following the same procedure as in Example 11 except for using a tris(quinolinol)aluminum complex (Alq3) as a host material of an emissive material and 4-(dicyanomethylene)-2-t-butyl-6-(1,1,7,7-tetramethyljulolidyl-9-enyl)-4H-pyran (DCJTB) as a guest material of an emissive material in such a way that the concentration of doping is 2%. When a direct current of 1 mA was passed through this light emitting device, red-orange emission with emission brightness of 200 candelas/square meter was attained. The driving voltage at this time was 5.5 V. This light emitting device had very excellent durability and retained 80% of the emission brightness in 1000 hours in the condition of driving at a constant-current of 1 mA.

Examples 22 to 30

Light emitting devices were prepared by following the same procedure as in Example 21 except for using materials shown in Table 2 as an electron transporting material. The results of evaluations of the obtained light emitting devices were shown in Table 2.

TABLE 2

|  | Electron transporting material | Emission color | Emission brightness (cd/m$^2$) | Driving voltage (V) | Retention of emission brightness after a lapse of 1000 hours (%) |
|---|---|---|---|---|---|
| Example 21 | E-20 | Red-orange | 200 | 5.5 | 80 |
| Example 22 | E-9 | Red-orange | 200 | 5.4 | 80 |
| Example 23 | E-57 | Red-orange | 200 | 5.5 | 80 |
| Example 24 | E-25 | Red-orange | 205 | 5.5 | 82 |
| Example 25 | E-23 | Red-orange | 200 | 5.5 | 80 |
| Example 26 | E-21 | Red-orange | 206 | 5.4 | 81 |
| Example 27 | E-33 | Red-orange | 200 | 5.6 | 79 |
| Example 28 | E-4 | Red-orange | 205 | 5.4 | 82 |
| Example 29 | E-8 | Red-orange | 208 | 5.4 | 82 |
| Example 30 | E-17 | Red-orange | 208 | 5.6 | 80 |

Comparative Example 9

A light emitting device was prepared by following the same procedure as in Example 21 except for using the above-mentioned P-1 as an electron transporting material. When a direct current of 1 mA was passed through this light emitting device, red-orange emission with emission brightness of 180 candelas/square meter was attained. The driving voltage at this time was 7.5 V. The emission brightness of this light emitting device decreased by half in 1000 hours in the condition of driving at a constant-current of 1 mA.

Comparative Example 10

A light emitting device was prepared by following the same procedure as in Example 21 except for using the above-mentioned P-2 as an electron transporting material. When a direct current of 1 mA was passed through this light emitting device, red-orange emission with emission brightness of 180 candelas/square meter was attained. The driving voltage at this time was 7.3 V. The emission brightness of this light emitting device decreased by half in 1000 hours in the condition of driving at a constant-current of 1 mA.

Comparative Example 11

A light emitting device was prepared by following the same procedure as in Example 21 except for using the above-mentioned P-3 as an electron transporting material. When a direct current of 1 mA was passed through this light emitting device, red-orange emission with emission brightness of 190 candelas/square meter was attained. The driving voltage at this time was 7.4 V. The emission brightness of this light emitting device decreased by half in 800 hours in the condition of driving at a constant-current of 1 mA.

Comparative Example 12

A light emitting device was prepared by following the same procedure as in Example 21 except for using the above-mentioned P-4 as an electron transporting material. When a direct current of 1 mA was passed through this light emitting device, red-orange emission with emission brightness of 200 candelas/square meter was attained. The driving voltage at this time was 7.5 V. The emission brightness of this light emitting device decreased by half in 800 hours in the condition of driving at a constant-current of 1 mA.

Comparative Example 13

A light emitting device was prepared by following the same procedure as in Example 21 except for using the above-mentioned P-5 as an electron transporting material. When a direct current of 1 mA was passed through this light emitting device, red-orange emission with emission brightness of 190 candelas/square meter was attained. The driving voltage at this time was 7.5 V. The emission brightness of this light emitting device decreased by half in 600 hours in the condition of driving at a constant-current of 1 mA.

Comparative Example 14

A light emitting device was prepared by following the same procedure as in Example 21 except for using the above-mentioned P-6 as an electron transporting material. When a direct current of 1 mA was passed through this light emitting device, red-orange emission with emission brightness of 200 candelas/square meter was attained. The driving voltage at this time was 6.5 V. The emission brightness of this light emitting device decreased by half in 1000 hours in the condition of driving at a constant-current of 1 mA.

Example 31

A light emitting device was prepared by following the same procedure as in Example 11 except for using 4,4'-bis (diphenylvinyl)biphenyl (DPVBi) as a host material of an emissive material and bis(carbazolylvinyl)biphenyl (BCZ-VBi) as a guest material of an emissive material in such a way that the concentration of doping is 5%. When a direct current of 1 mA was passed through this light emitting device, blue emission with emission brightness of 190 candelas/square meter was attained. The driving voltage at this time was 4.8 V. Thus, the material for a light emitting device of the present invention also functions in a blue light emitting device. The emission brightness of this light emitting device decreased by half in 100 hours in the condition of driving at a constant-current of 1 mA and the reason for this was that not the electron transporting material but the host material is crystallized with time.

Comparative Example 15

A light emitting device was prepared by following the same procedure as in Example 31 except for using the above-mentioned P-2 as an electron transporting material. When a direct current of 1 mA was passed through this light emitting device, blue emission with emission brightness of 150 candelas/square meter was attained. The driving voltage at this time was 6.5 V. The emission brightness of this light emitting device decreased by half in 10 hours in the condition of driving at a constant-current of 1 mA.

Example 32

A light emitting device was prepared by following the same procedure as in Example 21 except for using 1,4-diketo-2,5-bis(3,5-dimethylbenzyl)-3,6-bis(4-methylphenyl)pyrrolo[3,4-c]pyrrole as a host material of an emissive material and 4,4-difluoro-1,3,5,7-tetraphenyl-4-bora-3a,4a-diaza-indacene as a guest material of an emissive material in such a way that the concentration of doping is 1%. When a direct current of 1 mA was passed through this light emitting device, red emission with emission brightness of 210 candelas/square meter was attained. The driving voltage at this time was 5.2 V. This light emitting device had very excellent durability and retained 80% of the emission brightness in 1000 hours in the condition of driving at a constant-current of 1 mA.

Examples 33 to 41

Light emitting devices were prepared by following the same procedure as in Example 32 except for using materials shown in Table 3 as an electron transporting material. The results of evaluations of the obtained light emitting devices were shown in Table 3.

TABLE 3

| | Electron transporting material | Emission color | Emission brightness (cd/m$^2$) | Driving voltage (V) | Retention of emission brightness after a lapse of 1000 hours (%) |
|---|---|---|---|---|---|
| Example 32 | E-20 | Red | 210 | 5.2 | 80 |
| Example 33 | E-9 | Red | 200 | 5.3 | 81 |
| Example 34 | E-57 | Red | 203 | 5.4 | 81 |
| Example 35 | E-25 | Red | 210 | 5.2 | 81 |
| Example 36 | E-23 | Red | 200 | 5.2 | 79 |
| Example 37 | E-21 | Red | 212 | 5.2 | 81 |
| Example 38 | E-33 | Red | 210 | 5.0 | 80 |
| Example 39 | E-4 | Red | 216 | 5.1 | 82 |
| Example 40 | E-8 | Red | 215 | 5.1 | 82 |
| Example 41 | E-17 | Red | 210 | 5.5 | 80 |

Comparative Example 16

A light emitting device was prepared by following the same procedure as in Example 32 except for using the above-mentioned P-1 as an electron transporting material. When a direct current of 1 mA was passed through this light emitting device, red emission with emission brightness of 200 candelas/square meter was attained. The driving voltage at this time was 6.5 V. The emission brightness of this light emitting device decreased by half in 1000 hours in the condition of driving at a constant-current of 1 mA.

Example 42

An ITO substrate, in which an ITO film of 130 nm in thickness was formed as an anode on the surface of an alkali-free glass plate of 1.1 mm in thickness by a sputtering deposition method, was cut into pieces having a size of 46 mm×38 mm. This ITO film was patterned into the form of 32 stripes with 300-μm pitches (residual width 270 μm) by a photolithographic process. One side of the ITO stripe in the longitudinal direction was widened to a 1.27-mm pitch (opening 800 μmin width) in order to facilitate external electrical connection. This substrate was cleaned with "SEMICOCLEAN 56" (produced by Furuchi Chemical Corporation) and placed in a vacuum deposition apparatus after treating with UV ozone, and the apparatus was evacuated until its vacuum reached below 5×10$^{-4}$ Pa. By a resistance heating method, 4,4'-bis(N-(m-tryl)-N-phenylamino)biphenyl was first vapor-deposited in a thickness of 150 nm as a hole transporting material, and a tris(quinolinol)aluminum complex was vapor-deposited in a thickness of 50 nm as an emissive material. Next, the E-20 was vapor-deposited in a thickness of 100 nm as an electron transporting material. The term thickness referred to herein means a readout by a quartz oscillating film thickness monitor. Next, a mask in which a Kovar plate of 50 μmin thickness was provided with 16 openings of 250 μm in width (equivalent to a residual width of 50 μm and 300-μm pitches) by wet-etching was subjected to mask change so as to be orthogonal to the ITO stripe in a vacuum and the mask was secured from the back side with a magnet so as to be in close contact with the ITO substrate. Further, after an organic layer of 0.5 nm was doped with lithium, aluminum was vapor-deposited in a thickness of 200 nm to prepare a 32×16 dots matrix device. This device was driven in matrix form and consequently characters could be displayed without crosstalk.

INDUSTRIAL APPLICABILITY

A material for a light emitting device and a light emitting device using the same of the present invention can be suitably used for the areas such as a display device, a flat panel display, a backlight, illumination, interior decoration, a sign, a signboard, an electron camera and an optical signal generator.

The invention claimed is:

1. A material for a light emitting device selected from compounds expressed by the following formula:

E-4
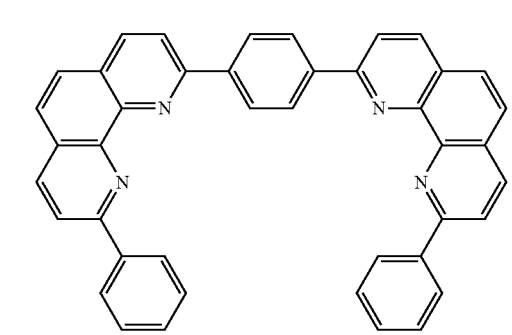

E-8
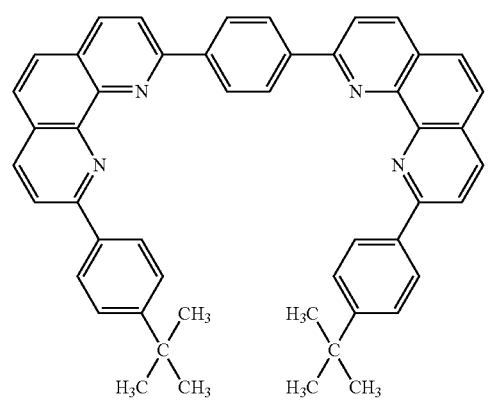

E-9
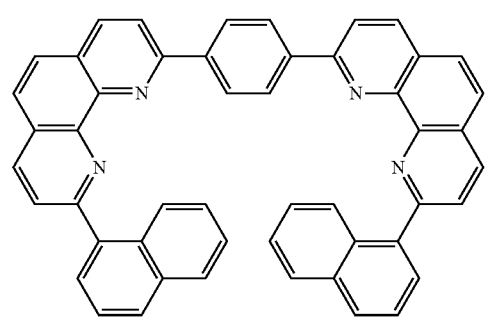

E-17
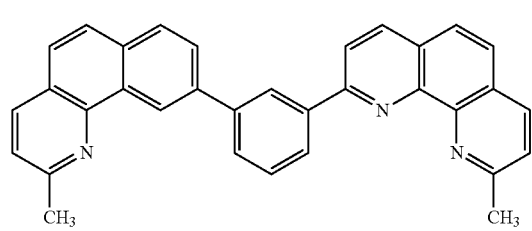

-continued

E-20
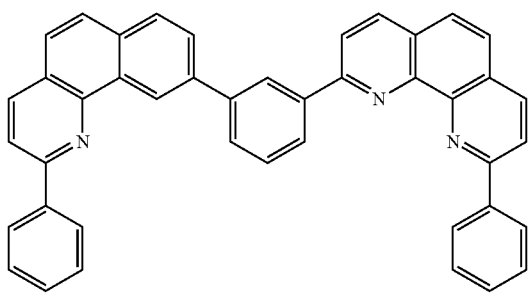

E-21
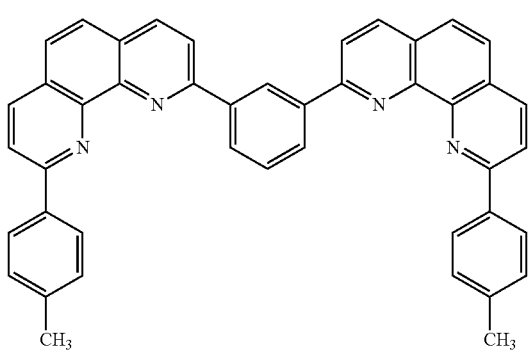

E-23
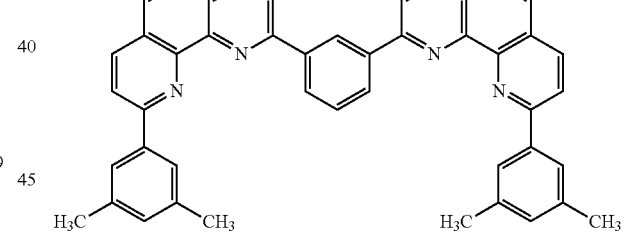

E-25
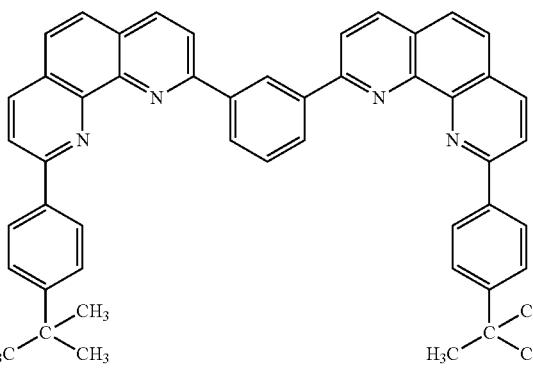

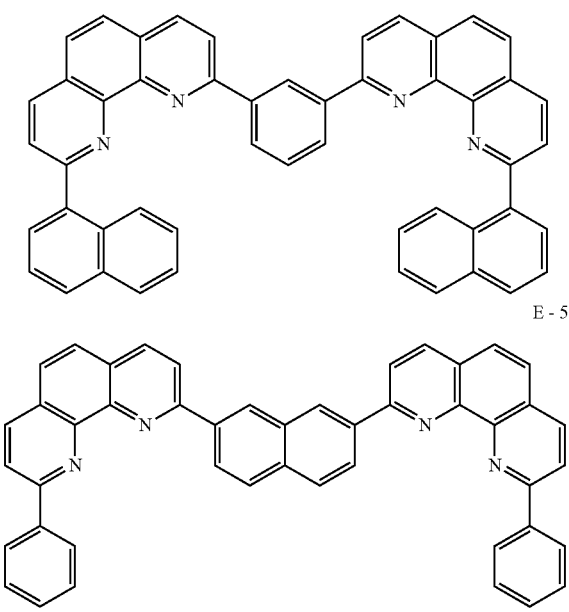

2. A light emitting device having an organic layer existing between an anode and a cathode and emitting light by electrical energy, wherein said organic layer contains the material for a light emitting device according to claim 1.

3. The light emitting device according to claim 2, wherein the emissive layer is a single layer.

4. The light emitting device according to claim 3, wherein the emissive layer comprises a host material and a dopant material.

5. The light emitting device according to claim 4, wherein the dopant material consists essentially of one kind of the dopant material.

6. The light emitting device according to claim 2, the light emitting device having at least an electron transporting layer existing between an anode and a cathode and emitting light by electrical energy, wherein said electron transporting layer contains the material for a light emitting device according to claim 1.

7. A light emitting device having an organic layer existing between an anode and a cathode and emitting light by electrical energy, wherein said organic layer contains the material for a light emitting device expressed by the general formula (2):

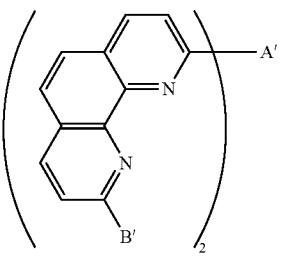

(2)

wherein A' is at least one kind selected from a 1,3-phenylene group, a 1,4-phenylene group, a 1,4-naphthylene group, a 1,5-naphthylene group, and a 2,7-naphthylene group, and B' is at least one kind selected from a methyl group, a t-butyl group, a substituted or unsubstituted phenyl group and a substituted or unsubstituted naphthyl group.

8. The light emitting device according to claim 7, the light emitting device having at least an electron transporting layer existing between an anode and a cathode and emitting light by electrical energy, wherein said electron transporting layer contains the material for a light emitting device expressed by the general formula (2).

* * * * *